(12) United States Patent
Kim et al.

(10) Patent No.: US 7,050,036 B2
(45) Date of Patent: May 23, 2006

(54) SHIFT REGISTER WITH A BUILT IN LEVEL SHIFTER

(75) Inventors: Byeong Koo Kim, Kumi-shi (KR); Jae Deok Park, Kyoungsangbuk-do (KR); Yong Min Ha, Kumi-shi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 335 days.

(21) Appl. No.: 10/315,238

(22) Filed: Dec. 10, 2002

(65) Prior Publication Data
US 2003/0128180 A1 Jul. 10, 2003

(30) Foreign Application Priority Data
Dec. 12, 2001 (KR) ............................. P2001-78450
Oct. 25, 2002 (KR) ...................... 10-2002-0065541

(51) Int. Cl.
G09G 3/36 (2006.01)
(52) U.S. Cl. ........................... 345/100; 345/98; 377/64
(58) Field of Classification Search .................. 345/98, 345/100, 559; 377/64
See application file for complete search history.

(56) References Cited

U.S. PATENT DOCUMENTS

| | | | |
|---|---|---|---|
| 4,779,956 A | 10/1988 | Nemoto et al. | |
| 4,785,297 A | 11/1988 | Sekiya | |
| 5,889,504 A * | 3/1999 | Kihara et al. | 345/100 |
| 6,091,392 A * | 7/2000 | Imamura | 345/100 |
| 6,133,897 A | 10/2000 | Kouchi | |
| 6,300,928 B1 * | 10/2001 | Kim | 345/92 |
| 6,426,743 B1 * | 7/2002 | Yeo et al. | 345/213 |
| 6,788,281 B1 * | 9/2004 | Ando et al. | 345/100 |
| 2001/0017608 A1 | 8/2001 | Kogure et al. | |
| 2001/0045932 A1* | 11/2001 | Mukao | 345/98 |

FOREIGN PATENT DOCUMENTS

| | | |
|---|---|---|
| DE | 2341714 A | 3/2000 |
| DE | 2343068 A | 4/2000 |
| EP | 0 484 164 A2 | 5/1992 |
| EP | 1 020 839 | 7/2000 |
| EP | 1 020 839 A2 | 7/2000 |
| GB | 2 343 068 A1 | 4/2000 |
| JP | 10026960 A | 1/1998 |

* cited by examiner

Primary Examiner—Sumati Lefkowitz
Assistant Examiner—Ke Xiao
(74) Attorney, Agent, or Firm—McKenna Long & Aldridge LLP

(57) ABSTRACT

A shift register employs only a thin film transistor of the same type channel and has a level shifter built-in. A shift register with a built in level shifter includes a plurality of stages and a plurality of level shifters. The stages are connected in cascade to shift a start pulse inputted through an input terminal and sequentially output the shifted pulse. The level shifters level-shift a voltage level of the shifted pulse applied from each of the stages and outputting it.

89 Claims, 12 Drawing Sheets

SHIFT REGISTER WITH A BUILT IN LEVEL SHIFTER

This application claims the benefit of Korean Patent Application No. P2001-78450, filed on Dec. 12, 2001 and P2002-65541, filed on Oct. 25, 2002, which is hereby incorporated by reference for all purposes as if fully set forth herein.

BACKGROUND OF THE INVENTION

1. Field of the Invention

The present invention relates to a shift register circuit, and more particularly to a shift register that employs only a thin film transistor of the same type channel and has a level shifter built-in. And, the present invention relates to a scanning driver, a data driver and a liquid crystal display having the shift register.

2. Description of the Related Art

Generally, a liquid crystal display LCD displays a picture using an electric field to control the light transmittance of a liquid crystal. To this end, the LCD includes a liquid crystal display panel having liquid crystal cells arranged in a matrix, and a driving circuit which drives the liquid crystal display panel. Within the liquid crystal display panel, gate lines and data lines are arranged so as to cross each other, and liquid crystal cells are positioned at intersections between the gate lines and the data lines. The liquid crystal display panel is provided with a pixel electrode and a common electrode which applies the electric field to each of the liquid crystal cells. Each pixel electrode is connected, via source and drain terminals of a thin film transistor acting as a switching device, to the data lines. The gate terminal of the thin film transistor is connected to the gate lines.

The driving circuit includes a gate driver which drives the gate lines, and a data driver which drives the data lines. The gate driver sequentially applies a scanning signal to the gate lines to sequentially drive the liquid crystal cells on the liquid crystal display panel. Whenever any one of the gate lines is supplied with a gate signal, the data driver applies a video signal to corresponding ones of the data lines. A picture is displayed by applying an electric field between the pixel electrode and the common electrode in accordance with a video signal for each liquid crystal in the LCD.

Thin film transistors used in LCDs are classified into amorphous silicon type and polycrystalline silicon types, depending upon whether the semiconductor layer in the transistor is made from amorphous silicon or polycrystalline silicon.

Pixel density in LCDs using amorphous silicon type thin film transistors is relatively low because the amorphous silicon has a relatively small charge mobility. Further, use of the amorphous silicon type thin film transistor is disadvantageous in that it results in higher manufacturing costs of the LCD as peripheral driving circuits, such as the gate driver and the data driver, need to be manufactured separately and mounted in the liquid crystal display panel. On the other hand, LCDs may be manufactured at a relatively low cost using polycrystalline silicon type thin film transistors. Polycrystalline silicon type thin film transistors have a high charge mobility and therefore are used to create relatively high a pixel densities in LCDs. Polycrystalline silicon thin film transistors may also be formed with peripheral driving circuits that are buried and mounted in the liquid crystal display panel. Accordingly, an LCD employing a polycrystalline silicon type thin film transistor will be used in further discussion.

FIG. 1 schematically illustrates a configuration of an LCD employing conventional polycrystalline silicon type thin film transistors.

Referring to FIG. 1, the LCD includes a liquid crystal display panel 10 provided with a picture display area 12, data and gate shift register 14 and 16, respectively, a sampling switching array 15, a printed circuit board PCB 20 having a control chip 22 integrated with control circuitry and a data drive IC and a level shifter array 24 mounted thereon, and a flexible printed circuit FPC film 18 connecting the liquid crystal display panel 10 to the PCB 20.

The picture display area 12 displays a picture by a matrix of liquid crystal cells LC. Each of the liquid crystal cells LC is a switching device connected at an intersection between a gate line GL and a data line DL, which includes an thin film transistor TFT made from polycrystalline silicon. Since the thin film transistor TFT is made from polycrystalline silicon having a charge mobility (a hundred times larger than amorphous silicon) yielding a fast response speed, the liquid crystal cells LC are driven in a point sequence manner. The data lines DL receive video signals from the sampling switch array 15 driven with the data shift register 14. The gate lines GL receive scanning signals from the gate shift register 16.

The data shift register 14 includes a plurality of stages, the output terminals of which are connected to the sampling switches of the sampling switch array 15, respectively. The stages, as shown in FIG. 2, are connected in cascade and shift a source start pulse from the control chip 22 to sequentially apply sampling signals to the sampling switches.

More specifically, the stages ST1 to STn, shown in FIG. 2, are connected to an input line of a start pulse SP in cascade, and connected to three clock signal supplying lines of four-phase clock signal (C1 to C4) supplying lines, respectively. The four phase clock signals C1 to C4 are sequentially fed in a phase-delayed manner by one clock as shown in FIG. 3. Each of the stages ST1 to STn shifts the start pulse SP by one clock with the aid of three clock pulses from the clock signals C1 to C4 to output it. Signals SO1 to SOn, outputted from each of the stages ST1 to STn of the shift register, are applied as sampling signals and applied as a start pulse of the next stage.

The gate shift register 16 includes a plurality of stages, the output terminals of which are connected to the gate lines GL, respectively. The stages, as shown in FIG. 2, are connected in cascade and shift a start pulse from the control chip 22 to sequentially apply scanning pulses to the gate lines GL.

The sampling switch array 15 has an output terminal connected to each of the data lines DL and includes a plurality of sampling switches (not shown) driven with a sampling signal from the data shift register 14. The sampling switches sequentially sample video signals from the control chip 22 in response to said sampling signal to apply them to the data lines DL.

In this way, the picture display area 12 and the data shift register 14, the sampling switching array 15 and the gate shift register 16, which are included in the liquid crystal display panel 10, are formed in the same process since the polycrystalline silicon is employed. In this case, if the thin film transistors TFT in the liquid crystal display panel 10 are composed of only the transistors of the same type, i.e., NMOS or PMOS thin film transistors, the manufacturing cost can be reduced more than when they are composed of CMOS thin film transistors. Because there are included both P and N channels in case of using the CMOS thin film transistors, it is advantageous that the driving voltage has a wide range and it is easier to make an integrated circuit, however, there is a disadvantage that the manufacturing cost is high and the reliability is low since a number of processes are required. Accordingly, liquid crystal display panels 10 tend to be developed toward the use of only the PMOS or NMOS thin film transistor which reduces the number of the process to lower the manufacturing cost and has higher reliability relatively.

A control circuit (not shown) included in the control chip 22 sends video data applied from the exterior to the data drive IC (not shown) and provides driving control signals required for the data shift register 14 and the gate shift register 16. The data drive IC (not shown) converts the video data from the control circuit (not shown) into a video signal acting as an analog signal to apply it, via the FPC film 18, to the sampling switch array 15.

The level shifter array 24 increases swing widths of driving control signals (i.e., clock signal, etc.) inputted from the control circuit and applies them to the data shift register 14 and the gate shift register 16. For example, the level shifter array 24 allows a clock signal, which is generated from the control circuit and has a swing voltage below 10V, to be level-shifted so as to have a swing width of 10V or more (including a negative voltage) and outputs it. This is because a pulse having a swing width of 10V or more should be supplied in order to drive the thin film transistor formed in the liquid crystal display panel 10.

In other words, if the liquid crystal display panel 10 includes PMOS thin film transistors, then a driving pulse for driving the PMOS thin film transistors included in the sampling switch array 15 and the pixel area 12 is required to have a swing width of 10V or more in a negative direction. In order to provide such a driving pulse, a pulse having a swing width of 10V or more in a negative direction must be applied to the gate and data shift registers 14 and 16 as the clock signal. If the external circuit is implemented with a signal chip such as the control chip 22, a clock signal having a swing width within 10V may be easily produced, but a voltage having a swing width greater than 10V or with a negative value is produced with difficulty. In other words, it is difficult to ensure device characteristics while generating a voltage having a swing width more than 10V or a negative voltage and, hence, to manufacture an IC on a single chip. Accordingly, in the related art, the level shifter array 24, used for level-shifting a driving pulse of 10V to have a swing width of 10V or more including a negative voltage, is implemented using a separate chip mounted on the PCB 20. This configuration is disadvantageous that an external circuit mounted on the PCB 20 is made to be compact with great difficulty. Furthermore, since a clock signal including positive and negative voltages and having a swing width of 10V or more must be applied from the external circuit to the data shift register 14 and the gate shift register 16 of the liquid crystal display panel 10, a problem of a large power consumption is encountered.

SUMMARY OF THE INVENTION

Accordingly, the present invention is directed to a shift register that employs only a thin film transistor of the same type channel and has a level shifter built-in.

An advantage of the present invention is to provide a shift register that employs only a thin film transistor of the same type channel and has a built-in level shifter, which can lower the minimal voltage level of an input signal.

Another advantage of the present invention is to provide a scanning driver including a shift register with a built-in level shifter.

Still another advantage of the present invention is to provide a data driver including a shift register with a built-in level shifter.

Still another advantage of the present invention is to provide a liquid crystal display including a shift register with a built-in level shifter.

In order to achieve these and other advantages of the invention, a shift register with a built in level shifter according to the present invention includes a plurality of stages connected in cascade for shifting a start pulse inputted through an input terminal and sequentially outputting the shifted pulse; and a plurality of level shifters for level-shifting a voltage level of the shifted pulse applied from each of the stages and outputting it.

A scanning driver for applying a scanning pulse to scanning lines of a display panel according to the present invention has a shift register that includes a plurality of stages connected in cascade for shifting a start pulse inputted through an input terminal and sequentially outputting the shifted pulse; and a plurality of level shifters for level-shifting a voltage level of the shifted pulse applied from each of the stages and outputting it as the scanning pulse.

A data driver for applying a video signal to data lines of a display panel according to the present invention has a sampling switch array for sampling and outputting the video signal in response to an input sampling signal; and a shift register that includes: a plurality of stages connected in concave for shifting a start pulse inputted through an input terminal and sequentially outputting the shifted pulse; and a plurality of level shifters for level-shifting a voltage level of the shifted pulse applied from each of the stages and outputting it as the sampling signal.

A liquid crystal display according to the present invention includes a liquid crystal display panel having a liquid crystal cell matrix for displaying a picture; a scanning driver for applying a scanning pulse to scanning lines of the liquid crystal display panel; and a data driver for applying a video signal to data lines of the liquid crystal display panel. Herein, the scanning driver has a first shift register including: a plurality of first stages connected in concave for shifting a start pulse inputted through an input terminal and sequentially outputting the shifted pulse; and a plurality of first level shifters for level-shifting a voltage level of the shifted pulse applied from each of the first stages and outputting it as the scanning pulse. And, the data driver has a sampling switch array for sampling and outputting the video signal in response to an input sampling signal, and a second shift register including: a plurality of second stages connected in concave for shifting a start pulse inputted through an input terminal and sequentially outputting the shifted pulse; and a plurality of second level shifters for level-shifting a voltage level of the shifted pulse applied from each of the second stages and outputting it as the sampling signal.

Herein, the shift registers are composed of thin film transistors of only the same type channel.

Especially, the shift registers are composed of thin film transistors of only P channel.

The level shifters level down the minimal voltage level of the shifted pulse to a negative voltage and outputs it.

Each of the first stages and the second stages includes an output buffer for selecting and outputting either a first clock signal or a first supply voltage in accordance with voltages of a first node and a second node; a first controller for controlling the first node in accordance with the start pulse; and a second controller for controlling the second node in accordance with the start pulse and a second clock signal.

The first controller includes a first transistor having a conduction path between the start pulse and the first node, and a control electrode that controls the conduction path in accordance with the start pulse.

The first controller further includes a second transistor having a conduction path between an output terminal of the first transistor and the first node, and a control electrode that controls the conduction path in accordance with a third clock signal.

The first controller further includes a third transistor having a conduction path between the first node and an input line of the first supply voltage, and a control electrode that controls the conduction path in accordance with a voltage on the second node.

The second controller includes a fourth transistor having a conduction path between an input line of a second supply voltage and the second node, and a control electrode that controls the conduction path in accordance with the second clock signal; and a fifth transistor having a conduction path between the second node and the input line of the first supply voltage, and a control electrode that controls the conduction path in accordance with the start pulse.

The output buffer includes a sixth transistor having a conduction path between an input line of the first clock signal and an output line of the stage, and a control electrode that controls the conduction path in accordance with a voltage on the first node; and a seventh transistor having a conduction path between the output line of the stage and an input line of the first supply voltage, and a control electrode that controls the conduction path in accordance with a voltage on the second node.

The output buffer further includes a first capacitor connected between the control electrode of the sixth transistor and the output line of the stage for bootstrapping a voltage of the control electrode.

Each of the level shifters includes an output part for selecting and outputting either the first supply voltage or a third supply voltage in accordance with a voltage on a third node; and a third controller for controlling the third node in accordance with a fourth clock signal and the first node.

The third controller includes an eighth transistor having a conduction path between the third node and an output line of the level shifter, and a control electrode that controls the conduction path in accordance with the fourth clock signal; and a ninth transistor having a conduction path between an input line of the third supply voltage and the third node, and a control electrode that controls the conduction path in accordance with a voltage on the first node.

The output part includes a tenth transistor having a conduction path between the input line of the third supply voltage and the output line of the level shifter, and a control electrode that controls the conduction path in accordance with a voltage on the third node; and an eleventh transistor having a conduction path between the output line of the level shifter and the input line of the first supply voltage, and a control electrode that controls the conduction path in accordance with the fourth clock signal.

The level shifter further includes a twelfth transistor having a conduction path between the output line of the level shifter and the input line of the first supply voltage, and a control electrode that controls the conduction path in accordance with a voltage on the second node in order to prevent an output voltage of the output line of the level shifter from being distorted by an external noise.

The level shifter further includes a thirteenth transistor having a conduction path between the third node and the level shifter, and a control electrode that controls the conduction path in accordance with the voltage on the second node in order to prevent the output voltage of the output line of the level shifter from being distorted by a current leaked from the tenth transistor when the third node is in a floating state.

The level shifter further includes a fourteenth transistor having a conduction path between the output line of the level shifter and the input line of the first supply voltage, and a control electrode that controls the conduction path in accordance with the third clock signal in order to prevent the output voltage of the output line of the level shifter from being distorted by having the tenth transistor turned on, which is caused by the ninth transistor being turned on in accordance with the voltage on the first node in an interval when the start pulse is inputted.

The level shifter further includes a fifteenth transistor having a conduction path between the input line of the third supply voltage and an input line of the ninth transistor, and a control electrode that controls the conduction path in accordance with the third supply voltage in order to prevent the output voltage of the output line of the level shifter from being distorted by a current leaked from the ninth transistor.

The output part further includes a second capacitor connected between the control electrode of the tenth transistor and the output line of the level shifter for bootstrapping a voltage of the control electrode.

The third supply voltage has the highest voltage level, then the second supply voltage, and the first supply voltage has the lowest voltage level.

The first to fourth clock signals have their phases delayed by one clock signal in order of $4^{th}$, $1^{st}$, $2^{nd}$, $3^{rd}$ clock signal, and the fourth clock signal has the same phase as the start pulse.

Herein, the third controller includes: an eighth transistor having a conduction path between the third node and an output line of the level shifter, and a control electrode that controls the conduction path in accordance with the second clock signal; and a ninth transistor having a conduction path between an input line of the third supply voltage and the third node, and a control electrode that controls the conduction path in accordance with a voltage on the first node, and the output part includes: a tenth transistor having conduction path between the input line of the third supply voltage and the output line of the level shifter, and a control electrode that controls the conduction path in accordance with a voltage on the third node; and an eleventh transistor having conduction path between the output line of the level shifter and the input line of the first supply voltage, and a control electrode that controls the conduction path in accordance with the second clock signal.

Herein, an output pulse from the level shifter partially overlaps with an output pulse of the previous level shifter.

A thin film transistor, which is included in the liquid crystal display panel, the scanning driver and the data driver, has polycrystalline silicon used for a semiconductor layer, and the scanning driver and the data driver are built in the liquid crystal display panel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings.

Figure 1:
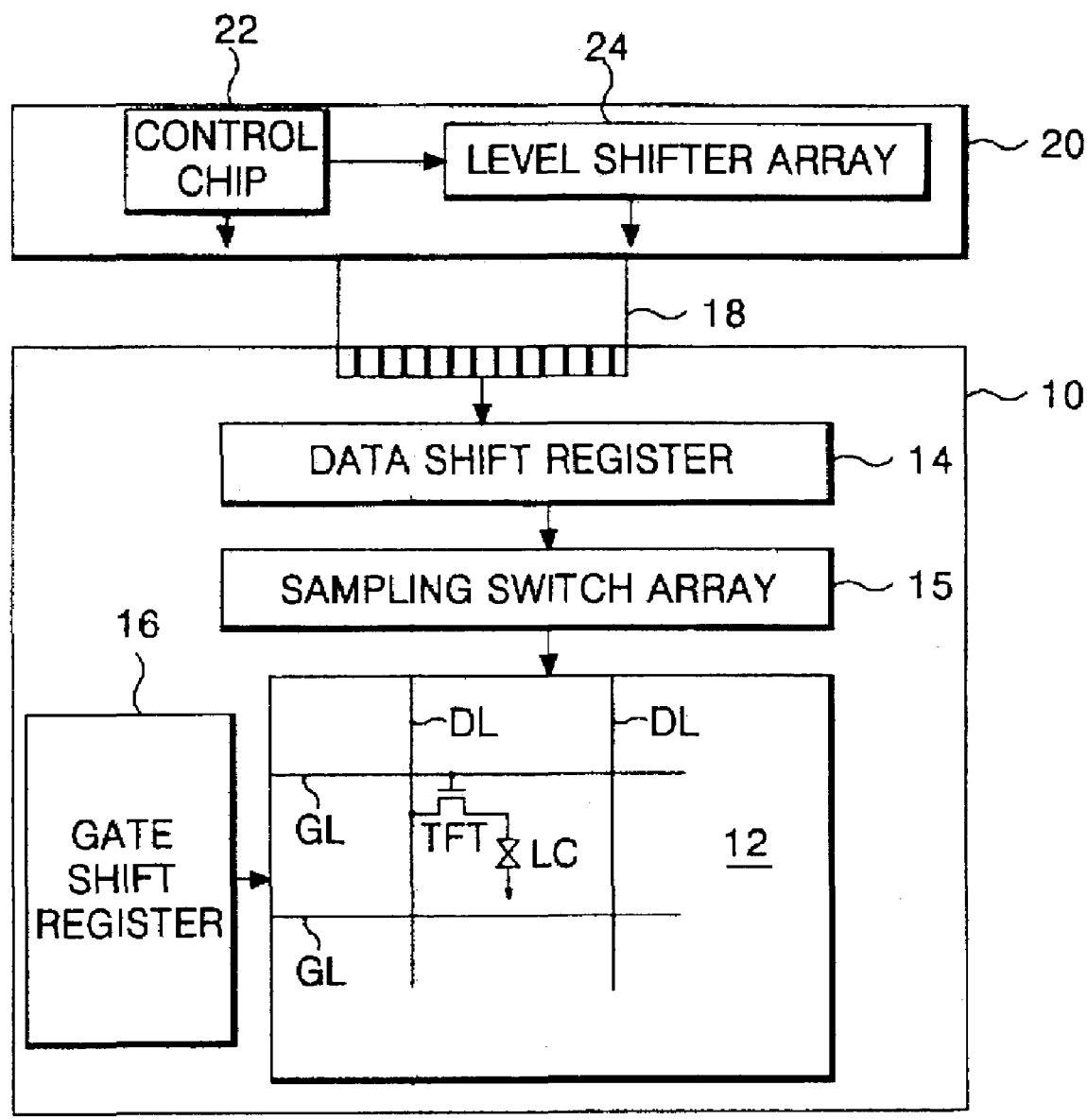
FIG. 1 illustrates schematic block diagram showing a configuration of a related art liquid crystal display employing polycrystalline silicon.
Figure 2:
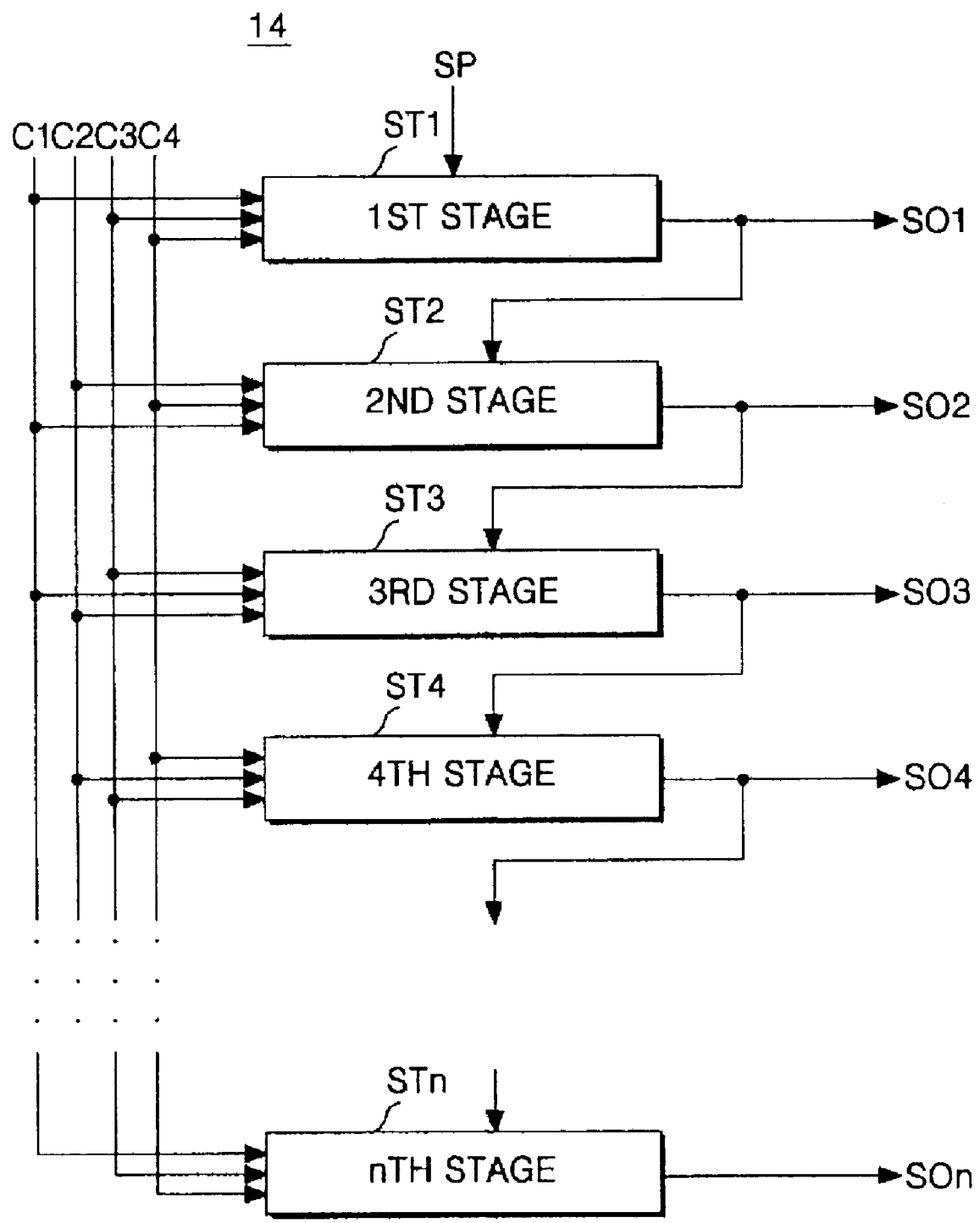
FIG. 2 illustrates a detailed block diagram of a shift register shown in FIG. 1.
Figure 3:
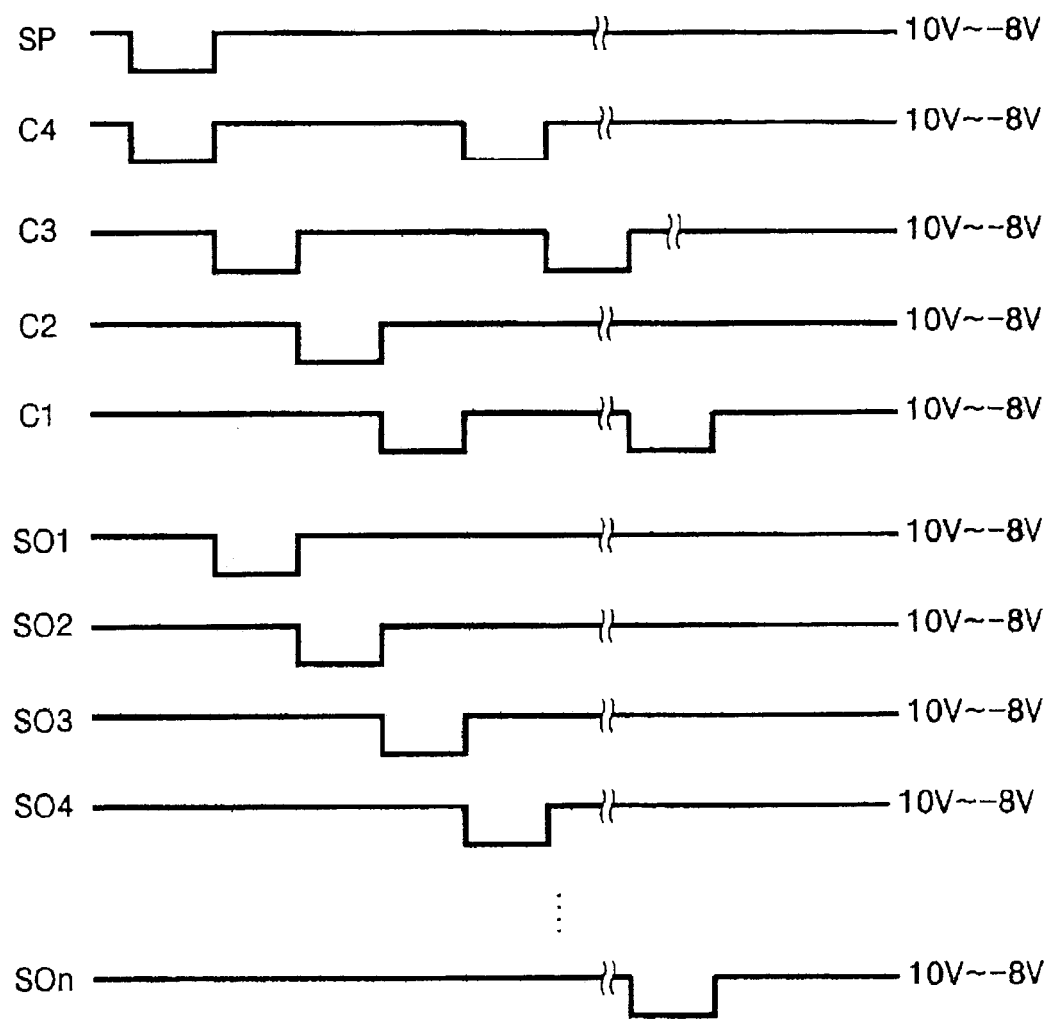
FIG. 3 illustrates input and output waveforms of the shift register shown in FIG. 2.
Figure 4:
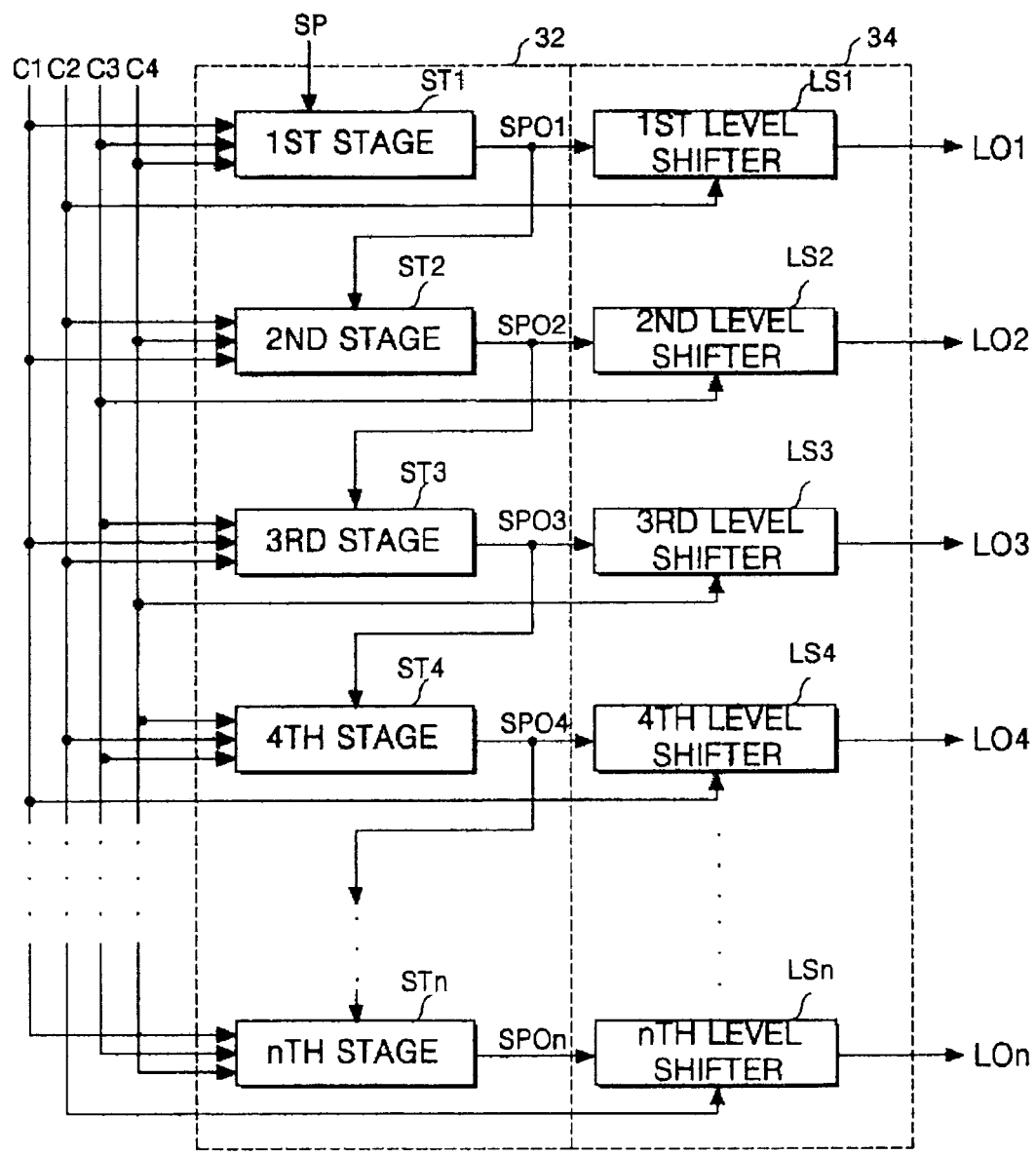
FIG. 4 illustrates a block diagram showing a configuration of a shift register with a level shifter according to an embodiment of the present invention.

Referring to FIG. 4, there is shown a block diagram of a shift register with a built in level shifter according to an embodiment of the present invention.

The shift register with the built in level shifter includes a shift stage array 32 consisting of n shift stages ST1 to STn connected to an input line of a start pulse SP in cascade and a level shifter array 34 consisting of level shifters LS1 to LSn connected to each output terminal of the stages ST1 to STn.

Figure 5A:
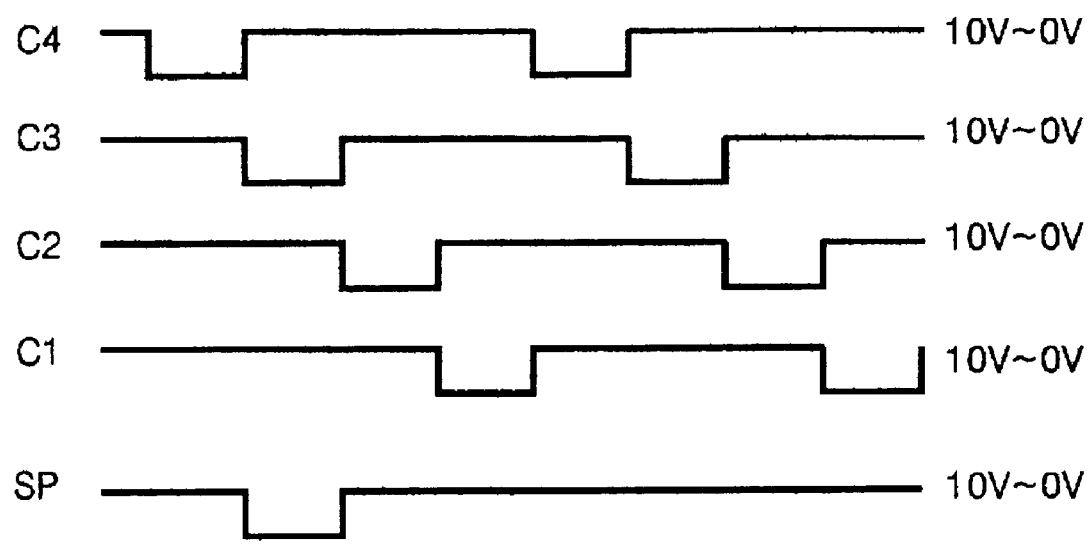
FIGS. 5A to 5C illustrate input and output waveforms of the shift register shown in FIG. 4.
Figure 5B:
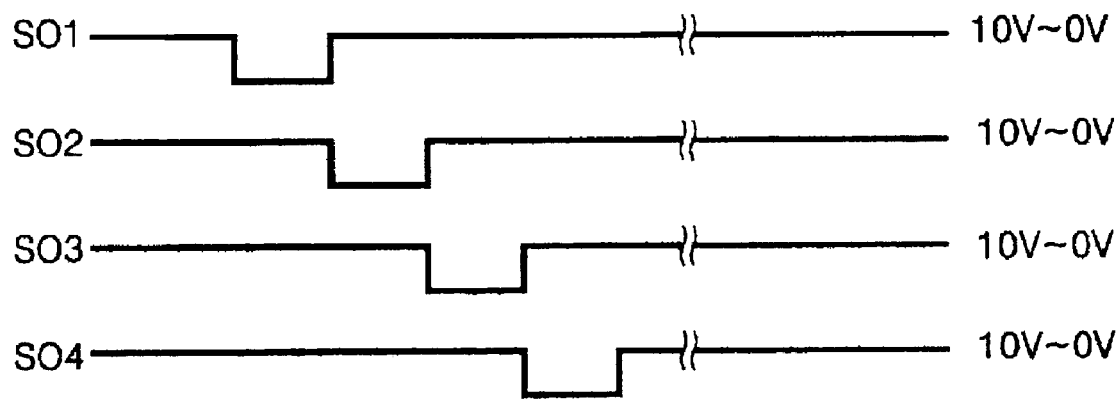
Figure 5C:
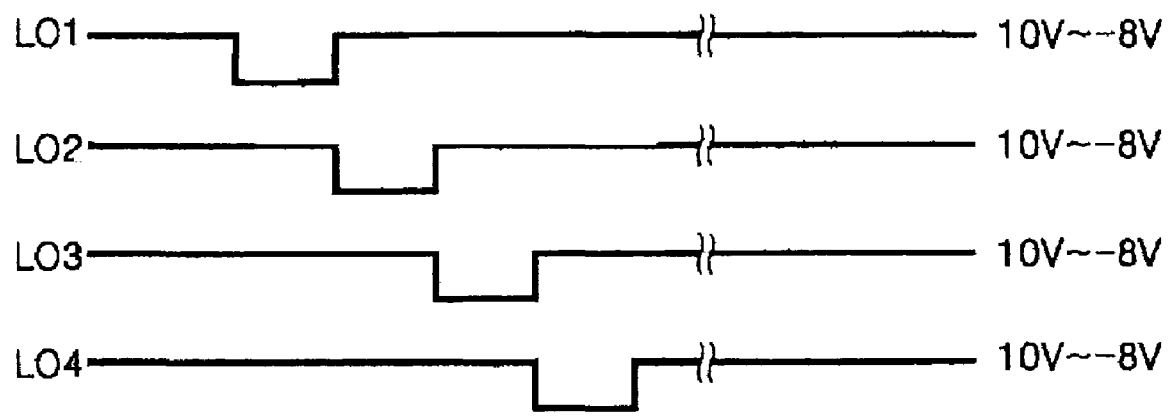

In the shift register array 32, the start pulse SP is inputted to the first stage ST1, and output signals of each of the previous stages are inputted to the second to $n^{th}$ stages ST2 to STn, respectively. The stages ST1 to STn receive three clock signals of the first to fourth clock signals C1 to C4 via first, second, and third clock signal input lines. Each of the first to fourth clock signals C1 to C4 have a sequentially delayed phase as shown in FIG. 5A. The stages ST1 to STn shift the start pulse SP with the aid of the three received clock signals to sequentially output shift signals SO1, SO2, ..., SOn as shown in FIG. 5B. In this case, the stages ST1 to STn output the output signals SO1, SO2, ..., SOn having a swing voltage of 10V or less with the aid of the input clock signals C1 to C4 and the start pulse SP. Each of the received clock signals also has a swing voltage of 10V. Each of the level shifters LS1 to LSn receives a remaining clock signal of the four clock signals C1 to C4 via a fourth clock signal input line, as shown in FIG. 4. Level shifters LS1 to LSn level-shift the shift signals SO1, SO2, ..., SOn outputted from the stages ST1 to STn to output signals LO1, LO2, ..., LOn as shown in FIG. 5C. The output signals LO1, LO2, ..., LOn have a swing voltage of 10V or more. Particularly, the level shifters LS1 to LSn levels down (or shifts down to a negative voltage level) the minimum voltage of the shift signals SO1, SO2, .., SOn outputted from the stages ST1 to STn to a negative voltage, then ouputs the changed voltage levels.

The outputted signals LO1, LO2, ..., LOn from the shift register with a built in level shifter are used as scanning pulses applied from a scanning (gate) driver to the scanning (gate) lines, to sequentially drive scanning (gate) lines of a display panel. Also, the outputted signals LO1, LO2, ..., LOn from the shift register with a built in level shifter are used as sampling signals applied to the sampling switches from the data driver to sample video signals and supply them to the data lines of the display panel.

Figure 6:
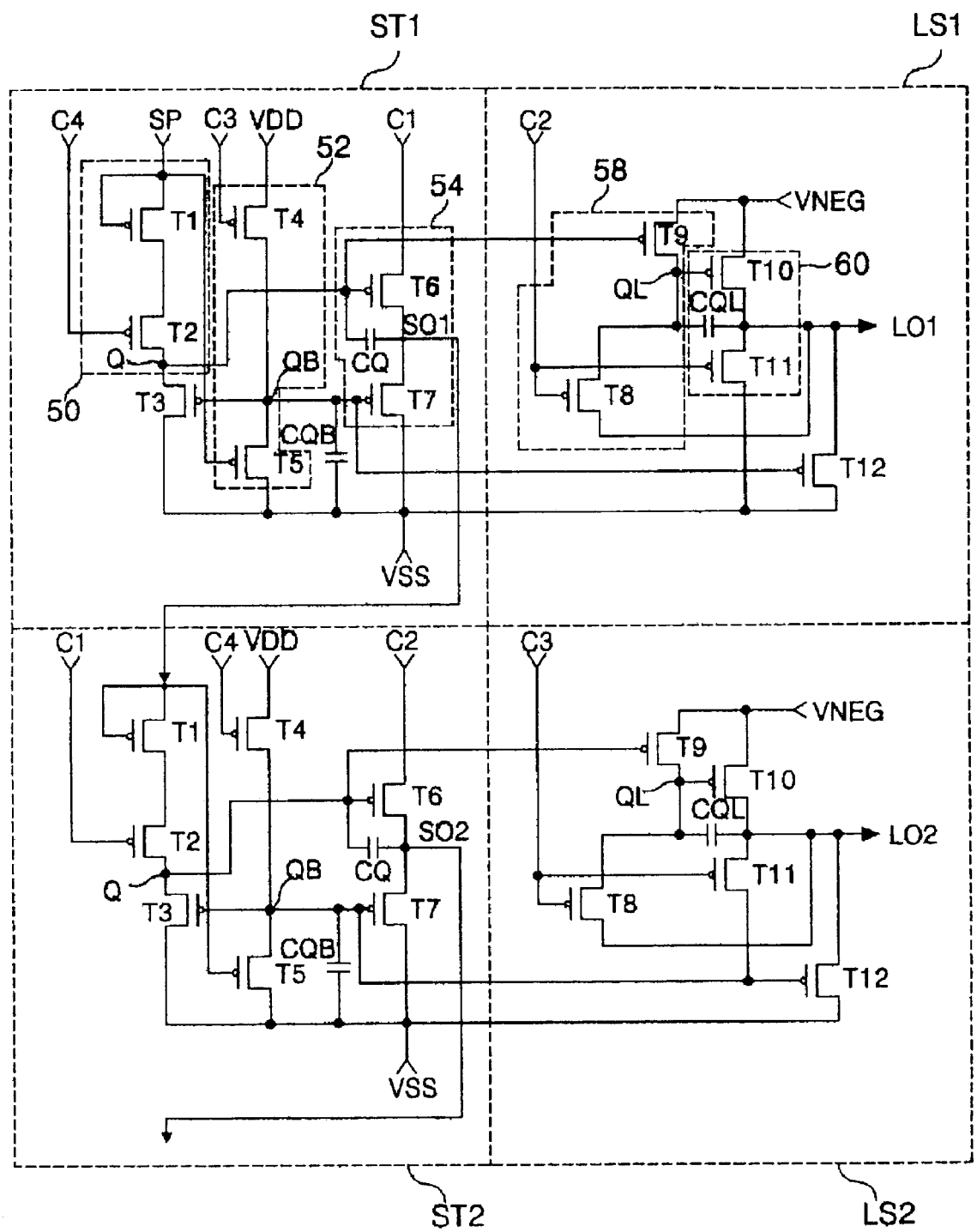
FIG. 6 illustrates a detailed circuit diagram of a shift register with a level shifter according to the first embodiment of the present invention.

FIG. 6 illustrates a detailed circuit configuration of the first and second stages ST1 and SR2 and the first and second level shifters LS1 and LS2 shown in FIG. 4.

Referring to FIG. 6, the first stage ST1 includes a first controller 50 controlling a Q node in accordance with the start pulse SP and the clock signal present at the third clock signal input line (e.g., the fourth clock signal C4); a second controller 52 controlling a QB node in accordance with the start pulse SP and the clock signal present at the second clock signal input line (e.g., the third clock signal C3); and a buffer 54 selecting either the clock signal present at the first clock signal input line (e.g., the first clock signal C1) or the first supply voltage VSS and outputting it in accordance with the voltage of the Q node and the QB node.

The first controller 50 controls a sixth PMOS transistor T6 of the buffer 54 through the Q node to have the first clock signal C1 applied as the output signal SO1 through the output line. To this end, the first controller 50 includes a first PMOS transistor T1 connected as a diode to the input line of the start pulse SP, and a second PMOS transistor T2 connected to the first PMOS transistor T1, an input line supplying the fourth clock signal C4 and the Q node.

The second controller 52 controls a seventh PMOS transistor T7 of the buffer 54 through the QB node to have the first supply voltage VSS applied as the output signal SO1 through the output line. To this end, the second controller 52 includes a fourth PMOS transistor T4 connected between an input line supplying the second supply voltage VDD, an input line supplying the third clock signal C3 and the QB node, and a fifth PMOS transistor T5 connected between the fourth PMOS transistor T4, the input line supplying the start pulse SP and the input line supplying the first supply voltage VSS.

The buffer 54 includes a sixth transistor T6 selecting the first clock signal C1 in accordance with the voltage of the Q node and applying it to the output line, and a seventh PMOS transistor T7 selecting the first supply voltage VSS in accordance with the voltage of the QB node and applying it to the output line.

And the first controller 50 further includes a third PMOS transistor T3 connected between the Q node, the QB node and the input line of the first supply voltage VSS, which together with the seventh PMOS transistor T7 controls the Q node at the same time.

Also, the first stage ST1 further includes a first capacitor CQ connected between the gate terminal and the source terminal of the sixth PMOS transistor T6, i.e, between the Q node and the output line, and a second capacitor CQB connected between the gate terminal and the source terminal of the seventh PMOS transistor T7, i.e., between the QB node and the first supply voltage VSS.

The first level shifter LS1 includes a third controller 58 controlling a QL node in accordance with the state of the clock signal present at the fourth clock signal input line (e.g., the second clock signal C2) and the Q node, an output part 60 selecting either a negative voltage VNEG or the first supply voltage VSS to output it in accordance with the voltage of the clock signal at the fourth clock signal input line (e.g., the second clock signal C2) and the QL node.

The third controller 58 directs the negative voltage VNEG to be applied to the output line of the first level shifter LS1 through the Q node in accordance with the state of the clock signal present at the fourth clock signal input line (e.g., the second clock signal C2) and the Q node. To this end, the third controller 58 includes an eighth PMOS transistor T8 connected between the input line supplying the second clock signal C2 and the QL node, and a ninth PMOS transistor T9 connected between the output line of the negative voltage VNEG, the Q node of the first stage ST1 and the QL node of the first level shifter LS1.

The output part 60 includes a tenth PMOS transistor T10 selecting the negative supply voltage VNEG in accordance with the voltage of the QL node to supply it to the output line, and a eleventh PMOS transistor T11 selecting the first supply voltage VSS to output it to the output line in accordance with the clock signal present at the fourth clock signal input line (e.g., the second clock signal C2).

And, the first level shifter LS1 further includes a twelfth PMOS transistor T12 connected between the output line of the first level shifter LS1, the QB node of the first stage ST1 and the first supply voltage VSS input line to prevent the distortion output signal LO1 on the output line. Also, the first level shifter LS1 further includes a third capacitor CQL connected between the gate terminal and the source terminal of the tenth PMOS transistor T10, i.e., between the QL node and the output line of the first level shifter LO1.

Figure 7:
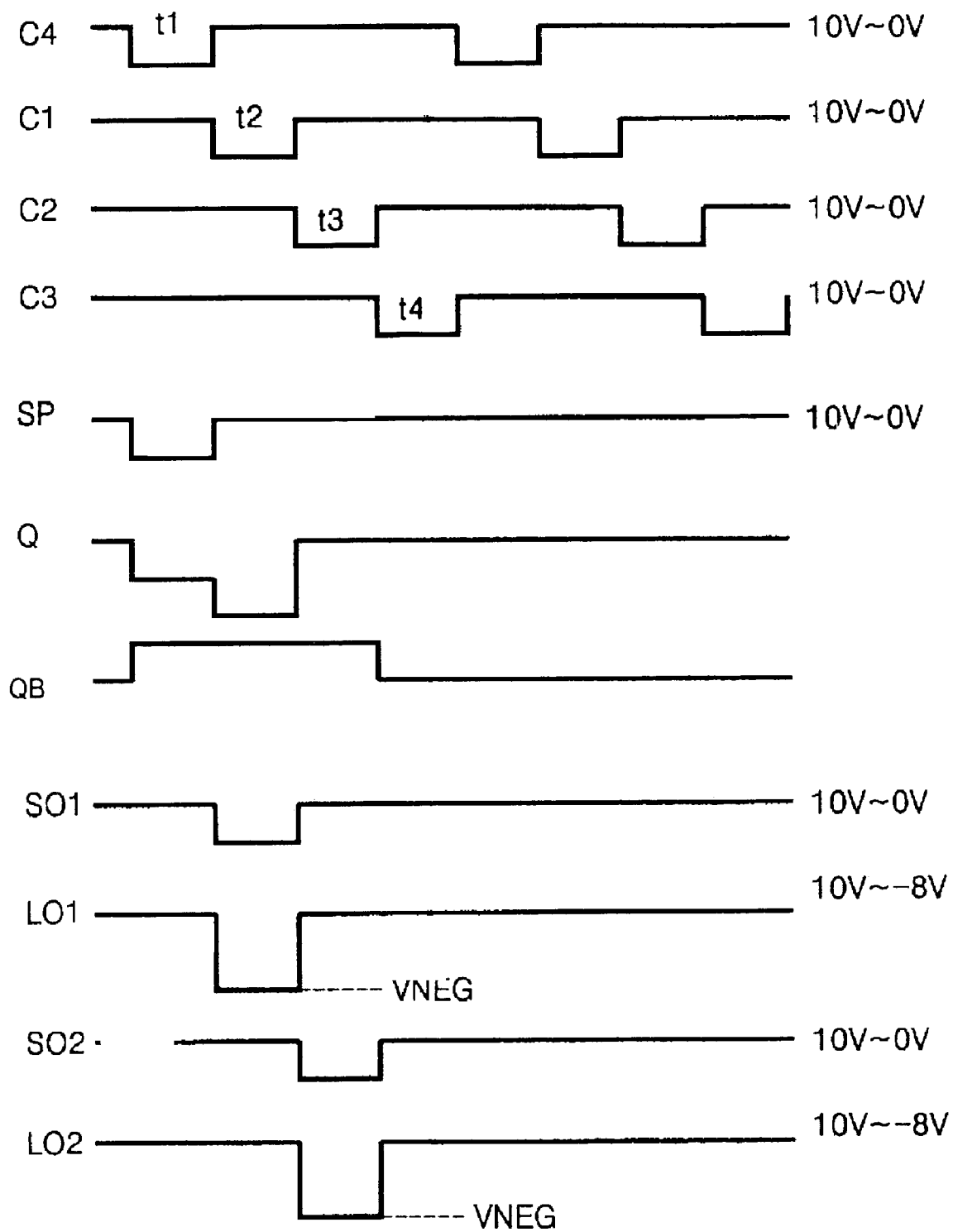
FIG. 7 illustrates input and output waveforms of the shift register shown in FIG. 6.

The first stage ST1 and the level shifter LS1 having the configuration as described above are supplied with the first to fourth clock signals C1 to C4 having a phase shape sequentially delayed by one clock signal as shown in FIG. 7. Here, the phase of the fourth clock signal C4 is synchronized with the start pulse SP. The first to fourth clock signals C1 to C4 including the start pulse SP are applied as a negative polarity pulse having a swing voltage of 10V or less. In this case, it is assumed that the 10V level should be a low state while the 0V level should be a high state.

With reference to such a driving waveform, operations of the first stage ST1 and the level shifter LS1 will be described below.

In a t1 interval of time, if the start pulse SP and the fourth clock signal C4 are synchronized in a high state, then the first and second PMOS transistors T1 and T2 are turned on to thereby charge a voltage of about 2V into the Q node. Thus, the sixth and ninth PMOS transistors T6 and T9 having their gate terminals connected to the Q node are slowly turned on. Further, the fifth PMOS transistor T5 is turned on by the high state of start pulse SP to thereby charge a voltage of 10V from the first supply voltage (VSS) input line into the QB node. Accordingly, the third and seventh PMOS transistors T3 and T7 having the gate terminals connected to the QB node are turned off. As a result, a 10V voltage of the first clock signal C1 remaining at a low state is applied to the output line of the first stage ST1, via the turned-on sixth PMOS transistor T6, to charge the output line at a low state (i.e., 10V). Also, a negative voltage VNEG of −8V is charged in the QL node through the turned-on ninth PMOS transistor T9 to weakly turn on the tenth PMOS transistor T10, but, because the QB node is at the high state, the twelfth PMOS transistor T12 is turned on to charge the 10V voltage into the output line of the first level shifter LS1.

In a t2 interval of time, if the start pulse SP and the fourth clock signal C4 become a low state while the first clock signal C1 becomes a high state, then an internal parasitic capacitor Cgs (not shown) defined between the gate terminal and the source terminal of the sixth PMOS transistor T6 and the first capacitor CQ induces a bootstrapping phenomenon. Thus, the Q node charges a voltage up to a high state of −7V. Such a bootstrapping phenomenon is possible because all the first to third PMOS transistors T1 to T3 are turned off, thereby allowing the Q node to exist in a floating state.

Accordingly, the sixth PMOS transistor T6 is turned on and rapidly charges a high voltage of 0V of the first clock signal C1 into the output line of the first stage ST1 to allow the output line to be a high state of 0V. And, the ninth PMOS transistor T9 is turned on and rapidly charges a negative voltage (VNEG) of −8V into the output line of the first level shifter LS1, via the turned on tenth PMOS transistor T10. In this case, an internal parasitic capacitor Cgs (not shown) defined inside the tenth PMOS transistor T10 and the third capacitor CQL cause a bootstrapping phenomenon at the QL node, which, in turn, induces a high state rising up to −18V to thereby charge a negative voltage VNEG into the output line of the level shifter LS1 rapidly.

In a t3 interval of time, if the first clock signal C1 becomes a low state while the second clock signal C2 becomes a high state, then a voltage at the Q node again drops to about 2V and a low state voltage (i.e., 10V) of the first clock signal C1 is charged, via the turned-on sixth PMOS transistor T6, into the output line of the first stage ST1. Further, the eleventh PMOS transistor T11 is turned on by a high state of second clock signal C2 to charge the first supply voltage VSS of about 10V to the output line of the first level shifter LS1. In this case, the eighth PMOS transistor T8 is turned on by a high state of second clock signal C2 to charge a voltage of about 7.2V into the QL node, thereby turning off the tenth PMOS transistor T10.

In a t4 interval of time, if the third clock signal C3 becomes a high state, then the fourth PMOS transistor T4 is turned on to charge the second supply voltage VDD of 0V into the QB node, thereby turning on the third, seventh, and twelfth PMOS transistors T3, T7, and T12. A voltage of about 2V charged in the Q node is changed into 10V via the turned-on third PMOS transistor T3, and the output line of the first stage ST1 remains at 10V via the turned-on seventh transistor T7. Further, by the turned-on twelfth PMOS transistor T12, the output line of the first level shifter LS1 remains at 10V. In this case, the second capacitor CQB prevents a voltage at the QB node from being distorted by a leakage current from the third and seventh PMOS transistors T3 and T7.

In a t5 interval of time, if the fourth clock signal becomes a high state, then the second PMOS transistor T2 is turned on. However, since the first and fifth PMOS transistors T1 and T5 remain in turned-off state, the QB node remains at 0V. Thus, the PMOS transistors T3, T7 and T12 continuously maintain a turned-off state, so that the output line of the first stage ST1 and the output line of the first level shifter LS1 remain at 10V.

The second stage ST2 and the second level shifter LS2 have the same configuration as the first stage ST1 and the first level shifter LS1, as mentioned above, except that the second stage ST2 and the second level shifter LS2 are operated, as described above, using the output signal of the first stage ST1 in place of the start pulse SP and the clock signals having a phase difference by one clock signal as compared with the clock signals used in the first stage ST1 and the level shifter LS1. Accordingly, the second stage ST2 and the second level shifter LS2 output the level shifted signal LO2 and the signal SO2 shifted by one clock signal in comparison with the first stage ST1 and the level shifter LS1.

Figure 8:
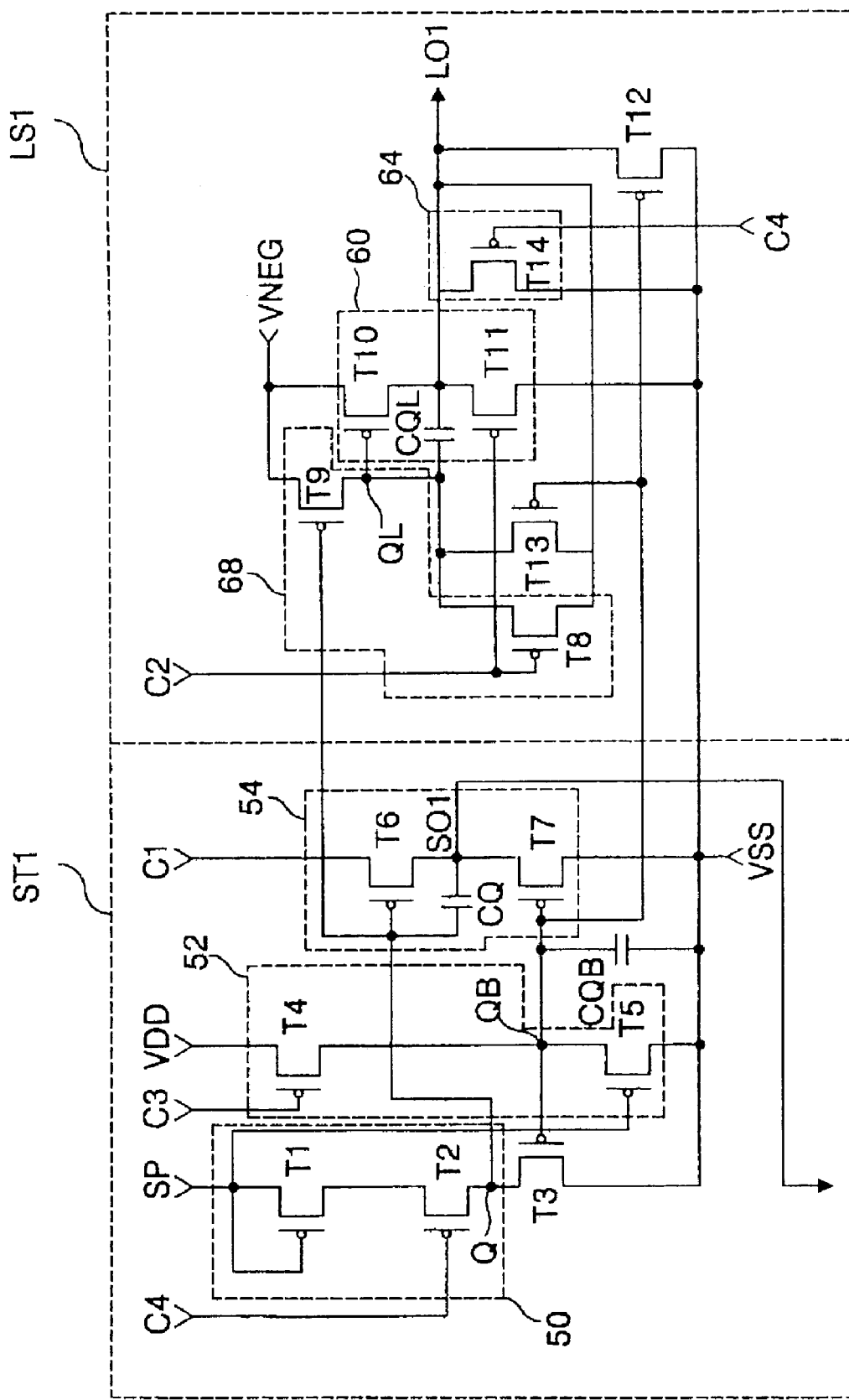
FIG. 8 illustrates a detailed circuit diagram of a shift register with a level shifter according to the second embodiment of the present invention.

FIG. 8 depicts a shift register with a built in level shifter according to another embodiment of the present invention and shows the detailed circuit of the first stage ST1 and the first level shifter LS1.

A first stage ST1 shown in FIG. 8 has the same configuration as the first stage ST1 shown in FIG. 6. The first level shifter LS1, when compared with the first level shifter LS1 shown in FIG. 6, further includes a thirteenth PMOS transistor T13 preventing the distortion of the output signal LS1 caused by leakage current of the tenth PMOS transistor T10 and a fourteenth PMOS transistor T14 preventing the distortion of the output signal LS1 by the pre-charging at the QL node. To this end, the thirteenth PMOS transistor T13 is connected between the QL node, the QB node and the output line of the first level shifter LS1, and the fourteenth PMOS transistor T14 is connected between the output line of the first level shifter LS1, a fifth clock signal input line (e.g., supplying the fourth clock signal C4) and the input line of the first supply voltage VSS.

Figure 9:
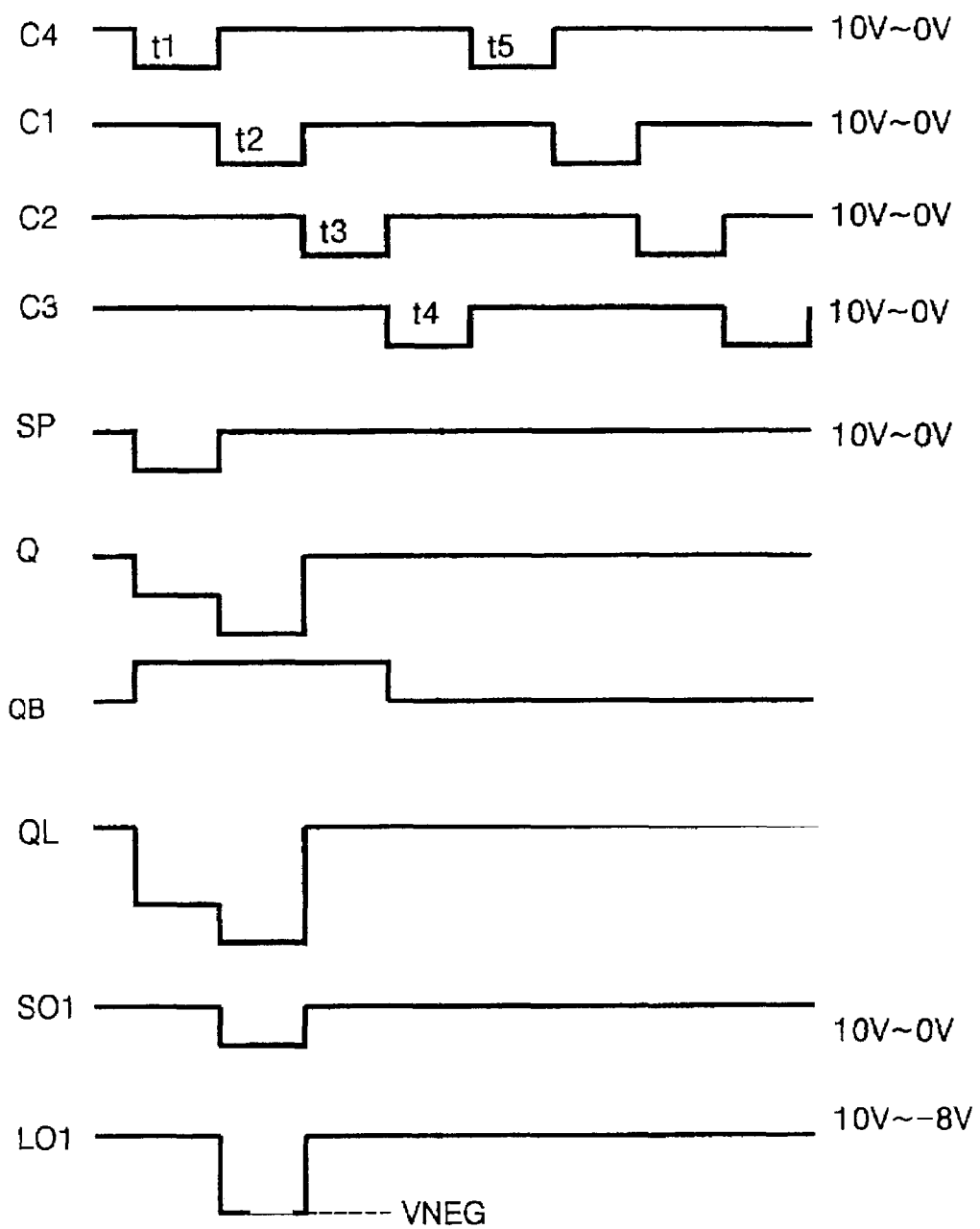
FIG. 9 illustrates input and output waveforms of the shift register shown in FIG. 8.

Hereinafter, operations of the first stage ST1 and the first shift register LS1 having the configuration as mentioned above will be described in conjunction with driving waveforms shown in FIG. 9.

In a t1 interval of time, if the start pulse SP and the fourth clock signal C4 are synchronized in a high state, then the first and second PMOS transistors T1 and T2 are turned on, to thereby charge a voltage of about 2V into the Q node. Thus, the sixth and ninth PMOS transistors T6 and T9 having the gate terminals connected to the Q node are slowly turned on. Further, the fifth PMOS transistor T5 is turned on by the high state of start pulse SP to thereby charge a voltage of 10V from the first supply voltage (VSS) input line into the QB node. Accordingly, the third and seventh PMOS transistors T3 and T7 having the gate terminals connected to the QB node are turned off. As a result, a 10V voltage of the first clock signal C1 remaining at a low state is applied to the output line of the shift register 56, via the turned-on sixth PMOS transistor T6, to charge the output line at a low state (i.e., 10V). Here, a negative voltage VNEG of −8V is pre-charged in the QL node through the turned-on tenth PMOS transistor T9 to cause an inflow of the −8V voltage into the output line of the first level shifter LS1, thereby distorting the output signal LO1 distorted. The fourteenth PMOS transistor T14 prevents the output LO1 of the first level shifter LS1 from being distorted in the T1 interval. To this end, the gate terminal of the fourteenth PMOS transistor T14 is connected to the fifth clock signal input line, while the source terminal and the drain terminal thereof are connected to the output line of the first level shifter LS1 and the first supply voltage VSS input line, respectively. Such a fourteenth PMOS transistor T14 is turned on by a high state of the clock signal present at the fifth clock signal input line (e.g., the fourth clock signal C4) to thereby maintain the output line of the first level shifter LS1 at 10V even though the QL node is pre-charged in the T1 interval so that the tenth PMOS transistor T10 is turned on.

In a t2 interval of time, if the start pulse SP and the fourth clock signal C4 become a low state while the first clock signal C1 becomes a high state, then an internal parasitic capacitor Cgs (not shown) defined between the gate and the source of the sixth PMOS transistor T6 and the first capacitor CQ induces a bootstrapping phenomenon. Thus, the Q node charges a voltage up to a high state of −7V. Accordingly, the sixth PMOS transistor T6 is turned on and charges a high voltage (i.e., 0V) of the first clock signal into the output line of the first stage ST1 rapidly, allowing the output line thereof to be at a high state of 0V. Also, the ninth PMOS transistor T9 is turned on to charge a negative voltage (VNEG) of −8V into the output line of the first level shifter LS1, via the turned-on tenth PMOS transistor T10. In this case, an internal parasitic capacitor Cgs (not shown) formed inside the eleventh PMOS transistor T10 and the second capacitor CQL cause a bootstrapping phenomenon at the QL node, which, in turn, induces a high state rising up to −18V to thereby charge a negative voltage VNEG of −8V into the output line of the first level shifter LS1 rapidly.

In a t3 interval of time, if the first clock signal C1 becomes a low state while the second clock signal C2 becomes a high state, then a voltage at the Q node again drops to about 2V and a low state voltage (i.e., 10V) of the first clock signal C1 is charged, via the turned-on sixth PMOS transistor T6, into the output line of the first stage ST1. Further, the eleventh PMOS transistor T11 is turned on by a high state of second clock signal C2 to charge the first supply voltage VSS of about 10V into the output line of the first level shifter LS1. In this case, the eighth PMOS transistor T8 is turned on by a high state of second clock signal C2 to charge a voltage of about 7.2V into the QL node, thereby turning off the tenth PMOS transistor T10.

In a t4 interval of time, if the third clock signal C3 becomes a high state, then the fourth PMOS transistor T4 is turned on to charge the second supply voltage VDD of 0V into the QB node, thereby turning on the third, seventh, and twelfth PMOS transistors T3, T7, and T12. A voltage of about 2V charged in the Q node is discharged into 10V via the turned-on third PMOS transistor T3, and the output line of the first stage ST1 remains at 10V via the turned-on seventh transistor T7. Further, with the aid of the turned-on twelfth PMOS transistor T12, the output line of the first level shifter LS1 remains at 10V.

Here, as the ninth PMOS transistor T9 goes into a turned-off state, the QL node is induced into a floating sate. In this case, the QL node slowly changes from a voltage of about 7V into a high state, i.e., −8V due to a leakage current from the tenth PMOS transistor T10. Accordingly, the tenth PMOS transistor T10 is slowly turned on, so that a voltage at the output line of the first level shifter LS1 may be distorted. The thirteenth PMOS transistor T13 prevents the output signal LO1 of the first level shifter LS1 from being distorted in the T4 interval. To this end, the thirteenth PMOS transistor T13 has a gate terminal connected to the QB node while having a source terminal and a drain terminal connected to the QL node and the output line of the first level shifter LS1, respectively. Such a thirteenth PMOS transistor T13 is turned on by a high state of the QB node caused by the turned-on fourth PMOS transistor T4. Thus, the QL node is electrically connected to the first level shifter LS1 to prevent a floating range from being generated. Furthermore, a low state voltage of 10V at the output line of the first level shifter LS1 is applied to the QL node to thereby maintain the tenth PMOS transistor T10 in a turned-off state, so that the output line of the first level shifter LS1 may remain at a low state of 10V.

In a t5 interval of time, if the fourth clock signal C4 becomes a high state, then the second PMOS transistor T2 is turned on. However, since the first and fifth PMOS transistors T1 and T5 remain in a turned-off state, the QB node remains at 0V. Thus, the PMOS transistors T3, T7, and T12 continuously maintain a turned-off state, so that the output line of the first stage ST1 and the output line of the first level shifter LS1 remain at 10V.

Figure 10:
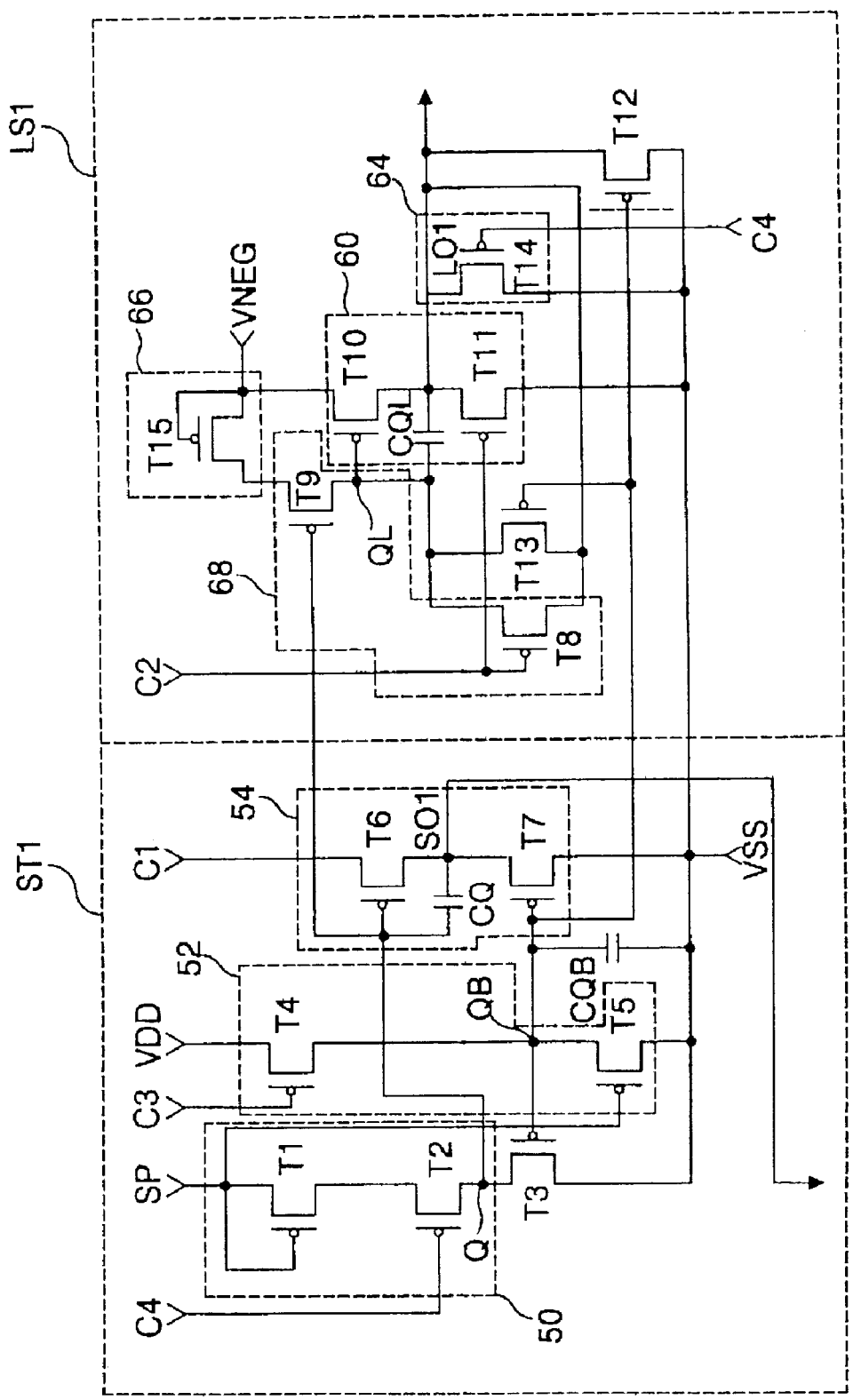
FIG. 10 illustrates a detailed circuit diagram of a shift register with a level shifter according to the third embodiment of the present invention.

FIG. 10 depicts a shift register according to still another embodiment of the present invention and especially shows a detailed circuit configuration of a first stage ST1 and a first level shifter LS1.

A first stage ST1 shown in FIG. 10 has the same configuration as the first stage ST1 shown in FIG. 8. The first level shifter LS1, when compared with the first level shifter LS1 shown in FIG. 8, further includes a fifteenth PMOS transistor T15 to prevent the distortion of the output signal LO1 resulting from a leakage current of the ninth PMOS transistor T9 distorting the voltage of the QL node. To this end, the fifteenth PMOS transistor T15 is connected as a diode 66 between the negative voltage VNEG input line and a source terminal of the tenth PMOS transistor T10.

Hereinafter, operations of the first stage ST1 and the first level shifter LS1 having the configuration as mentioned above will be described in conjunction with driving waveforms shown in FIG. 9.

In a t1 interval of time, if the start pulse SP and the fourth clock signal C4 are synchronized in a high state, then the first and second PMOS transistors T1 and T2 are turned on, to thereby charge a voltage of about 2V into the Q node. Thus, the sixth and ninth PMOS transistors T6 and T9 having the gate terminals connected to the Q node are slowly turned on. Further, the fifth PMOS transistor T5 is turned on by a high state of start pulse SP to thereby charge a voltage of 10V from the first supply voltage (VSS) input line into the QB node. Accordingly, the third and seventh PMOS transistors T3 and T7 having the gate terminals connected to the QB node are turned off. As a result, a 10V voltage of the first clock signal C1 remaining at a low state is applied to the output line of the first stage ST1, via the turned-on sixth PMOS transistor T6, to charge the output line at a low state (i.e., 10V). The fourteenth PMOS transistor T14 is turned on by a high state of fourth clock signal C4 to thereby maintain the output line of the first level shifter LS1 at 10V even though the tenth PMOS transistor T10 is turned on by pre-charging the QL node.

In a t2 interval of time, if the start pulse SP and the fourth clock signal C4 become a low state while the first clock signal C1 becomes a high state, then an internal parasitic capacitor Cgs (not shown) defined between the gate and the source of the sixth PMOS transistor T6 and the first capacitor CQ induces a bootstrapping phenomenon. Thus, the Q node charges up to a high state-of −7V. Accordingly, the sixth PMOS transistor T6 is turned on and charges a high voltage (i.e., 0V) of the first clock signal C1 into the output line of the first stage ST1 rapidly, thereby allowing the output line of the first stage ST1 to be at a high state of 0V. Also, the ninth PMOS transistor T9 is turned on to charge a negative voltage (VNEG) of −8V into the output line of the first level shifter LS1, via the turned-on tenth PMOS transistor T10.

On the other hand, the voltage at the QL node largely depends upon a threshold voltage Vth of a PMOS transistor. Accordingly, due to a difference of the threshold voltage Vth, a high state voltage charged in the output line of the first level shifter LS1 may be distorted. More specifically, when the Q node rises up to about −7V, the QL node also generates a bootstrapping phenomenon by a parasitic capacitor Cgs of the turned-on ninth PMOS transistor T9 and the third capacitor CQL to have a voltage rising up to about −18V.

Here, when the threshold voltage Vth of the PMOS transistor is −3V, the ninth PMOS transistor T9 enters a turned-off state under the condition that Vgs=1V and Vds=−10V, so that a −18V voltage loaded on the QL node can be held to maintain a −8V voltage applied to the output line of the first level shifter LS1 without any distortion, via the turned-on tenth PMOS transistor T10. On the other hand, when the threshold voltage Vth of the PMOS transistor is −1V, a −18V voltage loaded on the QL node is discharged into −8V by a leakage current from the ninth PMOS transistor T9, so that a voltage distortion phenomenon occurs, forcing a voltage at the output line of the first level shifter LS1 to drop down to −6.9V. In order to shut off such leakage current from the ninth PMOS transistor T9, the fifteenth PMOS transistor T15 is further introduced as a diode 66, between the negative voltage (VNEG) input line and the ninth PMOS transistor T9.

In a t3 interval of time, if the first clock signal C1 becomes a low state while the second clock signal C2 becomes a high state, then a voltage at the Q node again drops to about 2V and a low state voltage (i.e., 10V) of the first clock signal C1 is charged, via the turned-on sixth PMOS transistor T6, into the output line of the first stage ST1. Further, the eighth PMOS transistor T8 is turned on by a high state of second clock signal C2 to charge a voltage of about 7.2V into the QL node, thereby turning off the tenth PMOS transistor T10. At the same time, the eleventh PMOS transistor T11 is turned on by a high state of second clock signal C2 to thereby charge the first supply voltage VSS of about 10V into the output line of the first level shifter LS1.

In a t4 interval of time, if the third clock signal C3 becomes a high state, then the fourth PMOS transistor T4 is turned on to charge the second supply voltage VDD of 0V into the QB node, thereby turning on the third, seventh and thirteenth PMOS transistors T3, T7 and T13. A voltage of about 2V charged in the Q node is discharged into 10V via the turned-on third PMOS transistor T3, and the output line of the first stage ST1 remains at 10V via the turned-on seventh transistor T7. Further, with the aid of the turned-on thirteenth PMOS transistor T13, the output line of the first level shifter LS1 remains at the low state of 10V.

In a t5 interval of time, if the fourth clock signal C4 becomes a high state, then the second PMOS transistor T2 is turned on. However, since the first and fifth PMOS transistors T1 and T5 remain in a turned-off state, the QB node remains at 0V. Thus, the PMOS transistors T3, T7, and T12 continuously maintain a turned-off state, so that the output line of the first stage ST1 and the output line of the first level shifter LS1 remain at the low state of 10V.

As described above, the shift register with the built in level shifter according to the present invention outputs a shift signal with a swing voltage of 10V or more in use of a clock signal and a start pulse with a swing voltage of 10V or less. Especially, the shift register with the built in level shifter according to the present invention may have the minimal voltage level down in a negative direction using only PMOS transistors. The shift register with such a built in level shifter may be applied to a gate (scanning) driver and a data driver of the liquid crystal display illustrated in FIG. 11 and an electro-luminescence EL display device.

Here, when the above-mentioned shift register with the built in level shifter is applied to a data driver, a circuit operation having a faster speed is required. However, if the level shifter LS has a bad falling time characteristic, then the third clock signal C3, instead of the second clock signal C2, needs to be inputted to the eighth and eleventh PMOS transistors T8 and T11 included in the level shifter LS, via the fourth clock signal input line, for the purpose of proving an overlap driving. More specifically, when the second clock signal C2, as described above, is inputted to the eighth and eleventh PMOS transistors T8 and T11, the eighth and eleventh PMOS transistors T8 and T11 are turned on by a high state of second clock signal C2 in the t3 interval of time and charge the output line of the level shifter LS into a low state of 10V. On the other hand, when the third clock signal C3 is inputted to the eighth and eleventh PMOS transistors T8 and T11, the eighth and eleventh PMOS transistors T8 and T11 are turned off by a low state of second clock signal C2 in the t3 interval to maintain the output line of the level shifter at a high state of −8V. Then, the eighth and eleventh transistors T8 and T11 are turned on by a high state of third clock signal C3 in the t4 interval of time and charge the output line of the level shifter LS at a low state of 10V. Accordingly, the level shifter remains at a high state over the t3 and t4 intervals of time. In this case, the output waveform in the t3 interval of time that has the bad falling characteristic overlaps with the output waveform of the previous-stage level shifter to prevent its use, whereas the output waveform in the t4 interval of time that remains at a stable high state is used as a sampling signal.

Figure 11:
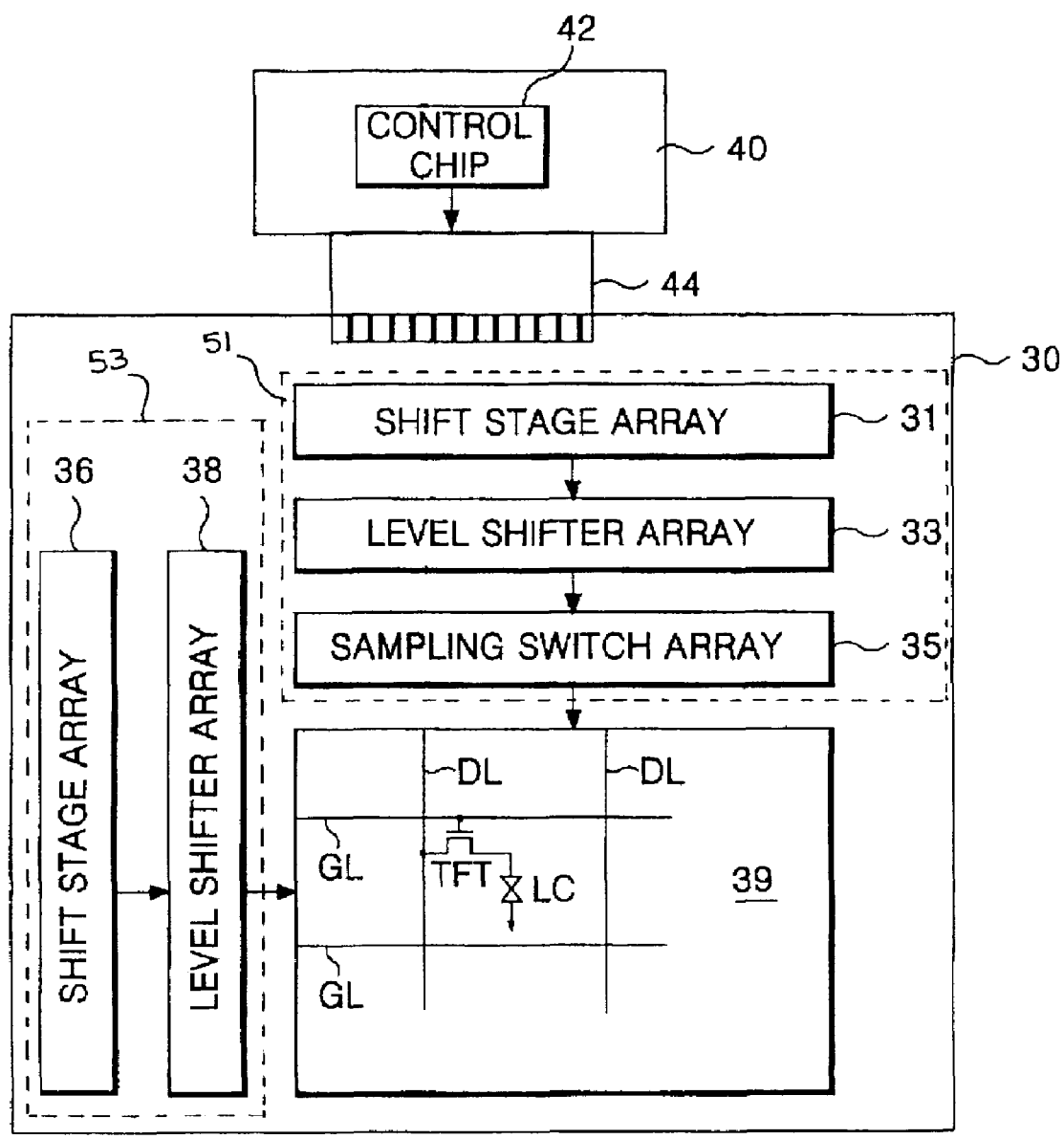
FIG. 11 illustrates a schematic block diagram showing a configuration of a polycrystalline silicon type liquid crystal display including a shift register with a level shifter according to an embodiment of the present invention.

FIG. 11 schematically illustrates a configuration of a polycrystalline silicon type LCD according to an embodiment of the present invention.

Referring to FIG. 11, the LCD includes a liquid crystal display panel 30 provided with a picture display area 39, a data shift register 51, a gate shift register 53 and a sampling switching array 35, a printed circuit board PCB 40 with a control chip 42 integrated with control circuitry and a data drive IC mounted on the PCB, and a flexible printed circuit FPC film 44 for electrically connecting the liquid crystal display panel 30 to the PCB 40.

The picture display area 39, the data shift register 51, the sampling switch array 35 and the gate shift register 53 included in the liquid crystal display panel 30 are made in the same process. In this case, each of thin film transistors included in the liquid crystal display panel 30 are configured only as NMOS or PMOS thin film transistors so as to minimize the number of manufacturing processes and enhance reliability of the LCD.

The picture display area 39 includes liquid crystal cells LC arranged in a matrix pattern to display a picture and are driven in a point sequence manner. Each of the liquid crystal cells LC includes a switching device connected at crossing points between a gate line GL and a data line DL. Each switching device includes a thin film transistor TFT made from polycrystalline silicon. The thin film transistor TFT made from polycrystalline silicon has a charge mobility hundred times larger than amorphous silicon, ensuring a fast response speed. The data lines DL receive video signals via the sampling switch array 35. The gate lines GL receive scanning pulses via the gate shift register 53.

The gate shift register 53 includes a shift stage array 36 consisting of a plurality of stages, as described above, and a level shifter array 38 consisting of level shifters each connected between the shift stages and the gate lines GL.

The stages of the shift stage array 36 shift the start pulse SP from the control chip 42 to sequentially supply the shifted pulse to the level shifters.

The level shifters of the level shifter array 38 increase a swing voltage of the shifted pulse from the stage to apply the shifted pulse having an increased swing voltage to the gate lines GL as a scanning pulse. For example, the level shifter array 38 level-shifts a shifted signal having a swing voltage of 10V or less inputted from the shift stage array 36 to have a swing width of 10V or more including a negative voltage, and outputs the level-shifted signal as an scanning pulse.

The data shift register 51 includes a shift stage array 31 consisting of a plurality of stages, as described above, and a level shifter array 38 consisting of level shifters each connected between the shift stages and the sampling switches of the sampling switch array 35.

The stages of the shift stage array 31 shift the start pulse SP from the control chip 42 to sequentially supply the shifted pulse to the level shifters.

The level shifters of the level shifter array 33 increase a swing voltage of the shifted pulse from the stage to apply the shifted pulse having an increased swing voltage to the sampling switches as a sampling signal. For example, the level shifter array 33 level-shifts a shifted signal having a swing voltage of 10V or less inputted from the shift stage array 31 to have a swing width of 10V or more including a negative voltage, and outputs the level-shifted signal as a sampling signal.

The sampling switch array 35 includes a plurality of sampling switches (not shown) having the output terminals connected to the data lines DL and driven with the sampling signal inputted from the data shift register 51. The sampling switches sample video signals inputted from the control chip 42 sequentially in response to the sampling signal to apply the sampled video signals to the data lines DL.

A control circuit (not shown) included in the control chip 42 sends video data applied from the exterior thereto to a data drive IC (not shown) and provides driving control signals required for the data shift register 51 and the gate shift register 53 via the FPC film 44. In this case, each of the clock signals applied from the control chip 42 to the data shift register 51 and the gate shift register 53 have a swing voltage of 10V or less, so that it is possible to reduce power consumption. The data drive IC converts video data inputted from the control circuitry into analog signals and applies it, via the FPC film 44, to the sampling switch array 35.

As described above, the shift register with the built in level shifter according to the present invention may have a level shifter built in only employing polycrystalline silicon thin film transistors of the same type, so that it is possible to level down the minimal voltage level of the input signal in a negative direction and to output it as a shift signal. Accordingly, the swing widths of the clock signals and the start pulse applied to the shift register are reduced to lower power consumption.

Also, the shift register with the built in level shifter according to the present invention may be applied to electroluminescence (EL) display devices using the polycrystalline silicon or the gate (scanning) and data drivers of the display panel of the liquid crystal display. In this case, it may be formed in the same process as a pixel matrix, to be built in the display panel so that it becomes possible to reduce the swing width of the clock signals and start pulses supplied to the display panel, thereby lowering power consumption.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display, comprising:
   a liquid crystal display panel having a liquid crystal cell matrix for displaying a picture;
   a scanning driver for applying a scanning pulse to scanning lines of the liquid crystal display panel; and
   a data driver for applying a video signal to data lines of the liquid crystal display panel, and
   wherein the scanning driver has a first shift register including a plurality of first stages connected in cascade for shifting a start pulse inputted through an input terminal and sequentially outputting the shifted pulse; and a plurality of first level shifters for level-shifting a voltage level of the shifted pulse applied from each of the first stages and outputting it as the scanning pulse,
   wherein the data driver has a sampling switch array for sampling and outputting the video signal in response to an input sampling signal, and a second shift register including: a plurality of second stages connected in cascade for shifting a start pulse inputted through an input terminal and sequentially outputting the shifted pulse; and a plurality of second level shifters for level-shifting a voltage level of the shifted pulse applied from each of the second stages and outputting it as the sampling signal,
   wherein each of the first stages and the second stages includes an output buffer for selecting and outputting either a clock signal at a first clock signal input line or a first supply voltage in accordance with voltages of a first node and a second node,
   wherein each of the first stages and the second stages includes a first controller for controlling the first node in accordance with the start pulse and a second controller for controlling the second node in accordance with the start pulse and a clock signal at a second clock signal input line;
   wherein each of the level shifters includes an output part for selecting and outputting either the first supply voltage or a third supply voltage in accordance with a voltage on a third node and a third controller for controlling the third node in accordance with a clock signal at a fourth clock signal input line and the first node.

2. The liquid crystal display according to claim 1, wherein the first and second shift registers include thin film transistors of only the same type channel.

3. The liquid crystal display according to claim 2, wherein the first and second shift registers include thin film transistors of only P-type channel.

4. The liquid crystal display according to claim 1, wherein the first and second level shifters shift a minimal voltage level of the shifted pulse to a negative voltage and outputs it.

5. The liquid crystal display according to claim 1, wherein the first controller includes:
   a first transistor having a conduction path between the start pulse and the first node, and a control electrode that controls the conduction path in accordance with the start pulse.

6. The liquid crystal display according to claim 5, wherein the first controller further includes:
   a second transistor having a conduction path between an output terminal of the first transistor and the first node, and a control electrode that controls the conduction path in accordance with a clock signal at a third clock signal input line.

7. The liquid crystal display according to claim 6, wherein the first controller further includes:
   a third transistor having a conduction path between the first node and an input line of the first supply voltage, and a control electrode that controls the conduction path in accordance with a voltage on the second node.

8. The liquid crystal display according to claim 7, wherein the second controller includes:
   a fourth transistor having a conduction path between an input line of a second supply voltage and the second node, and a control electrode that controls the conduction path in accordance with the clock signal at the second clock signal input line; and
   a fifth transistor having a conduction path between the second node and the input line of the first supply voltage, and a control electrode that controls the conduction path in accordance with the start pulse.

9. The liquid crystal display according to claim 8, wherein the output buffer includes:
   a sixth transistor having a conduction path between the first clock signal input line and an output line of the stage, and a control electrode that controls the conduction path in accordance with a voltage on the first node; and
   a seventh transistor having a conduction path between the output line of the stage and an input line of the first supply voltage, and a control electrode that controls the conduction path in accordance with a voltage on the second node.

10. The liquid crystal display according to claim 9, wherein the output buffer further includes:
    a first capacitor connected between the control electrode of the sixth transistor and the output line of the stage for bootstrapping a voltage of the control electrode.

11. The liquid crystal display according to claim 10, wherein the third controller includes:
    an eighth transistor having a conduction path between the third node and an output line of the level shifter, and a control electrode that controls the conduction path in accordance with the fourth clock signal; and
    a ninth transistor having a conduction path between an input line of the third supply voltage and the third node, and a control electrode that controls the conduction path in accordance with a voltage on the first node.

12. The liquid crystal display according to claim 11, wherein the output part includes:
    a tenth transistor having a conduction path between the input line of the third supply voltage and the output line of the level shifter, and a control electrode that controls the conduction path in accordance with a voltage on the third node; and
    an eleventh transistor having a conduction path between the output line of the level shifter and the input line of the first supply voltage, and a control electrode that controls the conduction path in accordance with the clock signal at the fourth clock signal input line.

13. The liquid crystal display according to claim 12, wherein the level shifter further includes:
    a twelfth transistor having a conduction path between the output line of the level shifter and the input line of the first supply voltage, and a control electrode that controls the conduction path in accordance with the voltage on the second node in order to prevent an output voltage of the output line of the level shifter from being distorted by an external noise.

14. The liquid crystal display according to claim 13, wherein the level shifter further includes:

a thirteenth transistor having a conduction path between the third node and the level shifter, and a control electrode that controls the conduction path in accordance with the voltage on the second node in order to prevent the output voltage of the output line of the level shifter from being distorted by a current leaked from the tenth transistor when the third node is in a floating state.

15. The liquid crystal display according to claim 14, wherein the level shifter further includes:

a fourteenth transistor having a conduction path between the output line of the level shifter and the input line of the first supply voltage, and a control electrode that controls the conduction path in accordance with a clock signal at a fifth clock signal input line in order to prevent the output voltage of the output line of the level shifter from being distorted by having the tenth transistor turned on, which is caused by the ninth transistor being turned on in accordance with the voltage on the first node in an interval when the start pulse is inputted.

16. The liquid crystal display according to claim 15, wherein the level shifter further includes:

a fifteenth transistor having a conduction path between the input line of the third supply voltage and an input line of the ninth transistor, and a control electrode that controls the conduction path in accordance with the third supply voltage in order to prevent the output voltage of the output line of the level shifter from being distorted by a current leaked from the ninth transistor.

17. The liquid crystal display according to claim 15, wherein the clock signals at the third and fifth clock signal input lines are the same.

18. The liquid crystal display according to claim 12, wherein the output part further includes:

a second capacitor connected between the control electrode of the tenth transistor and the output line of the level shifter for bootstrapping a voltage of the control electrode.

19. The liquid crystal display according to claim 10, wherein the third supply voltage has the highest voltage level, the first supply voltage has the lowest voltage level and the second supply voltage is between the third and first supply voltages.

20. The liquid crystal display according to claim 10, wherein the clock signals at the first to fourth clock signal input lines have their phases delayed by one clock signal in order of the clock signal at the third clock signal input line, the clock signal at the first clock signal input line, the clock signal at the fourth clock signal input line, and the clock signal at the second clock signal input line, wherein and the clock signal at the third clock signal input line has the same phase as the start pulse.

21. The liquid crystal display according to claim 20, wherein the third controller includes:

an eighth transistor having a conduction path between the third node and an output line of the level shifter, and a control electrode that controls the conduction path in accordance with the clock signal at the fourth clock signal input line; and a ninth transistor having a conduction path between an input line of the third supply voltage and the third node, and a control electrode that controls the conduction path in accordance with the voltage on the first node, and the output part includes:

a tenth transistor having conduction path between the input line of the third supply voltage and the output line of the level shifter, and a control electrode that controls the conduction path in accordance with a voltage on the third node; and an eleventh transistor having conduction path between the output line of the level shifter and the input line of the first supply voltage, and a control electrode that controls the conduction path in accordance with the clock signal at the fourth clock signal input line.

22. The liquid crystal display according to claim 21, wherein an output pulse from the level shifter partially overlaps with an output pulse of the previous level shifter.

23. The liquid crystal display according to claim 1, wherein a thin film transistor, which is included in the liquid crystal display panel, the scanning driver and the data driver, has polycrystalline silicon used for a semiconductor layer, and the scanning driver and the data driver are built in the liquid crystal display panel.

24. A shift register with a built in level shifter, comprising:

a plurality of stages connected in cascade for shifting a start pulse inputted through an input terminal and sequentially outputting the shifted pulse; and a plurality of level shifters for level-shifting a voltage level of the shifted pulse applied from each of the stages and outputting it, wherein each of the stages includes an output buffer for selecting and outputting either a clock signal at a first clock signal input line or a first supply voltage in accordance with voltages of a first node and a second node, wherein each of the stages includes a first controller for controlling the first node in accordance with the start pulse and a second controller for controlling the second node in accordance with the start pulse and a clock signal at a second clock signal input line, wherein each of the level shifters includes an output part for selecting and outputting either the first supply voltage or a third supply voltage in accordance with a voltage on a third node and a third controller for controlling the third node in accordance with a clock signal at a fourth clock signal input line and the first node.

25. The shift register with a built-in level shifter according to claim 24, wherein the stages and level shifters include thin film transistors of only the same type channel.

26. The shift register with a built-in level shifter according to claim 25, wherein the stages and level shifters include thin film transistors of only P-type channel.

27. The shift register with a built-in level shifter according to claim 24, wherein the level shifter shifts a minimal voltage level of the shifted pulse to a negative voltage and outputs it.

28. The shift register with a built-in level shifter according to claim 24, wherein the first controller includes:

a first transistor having a conduction path between the start pulse and the first node, and a control electrode that controls the conduction path in accordance with the start pulse.

29. The shift register with a built-in level shifter according to claim 28, wherein the first controller further includes:

a second transistor having a conduction path between an output terminal of the first transistor and the first node, and a control electrode that controls the conduction path in accordance with a clock signal at a third clock signal input line.

30. The shift register with a built-in level shifter according to claim 29, wherein the first controller further includes:
a third transistor having a conduction path between the first node and an input line of the first supply voltage, and a control electrode that controls the conduction path in accordance with a voltage on the second node.

31. The shift register with a built in level shifter according to claim 30, wherein the second controller includes:
a fourth transistor having a conduction path between an input line of a second supply voltage and the second node, and a control electrode that controls the conduction path in accordance with the clock signal at the second clock signal input line; and
a fifth transistor having a conduction path between the second node and the input line of the first supply voltage, and a control electrode that controls the conduction path in accordance with the start pulse.

32. The shift register with a built in level shifter according to claim 31, wherein the output buffer includes:
a sixth transistor having a conduction path between the first clock signal input line and an output line of the stage, and a control electrode that controls the conduction path in accordance with a voltage on the first node; and
a seventh transistor having a conduction path between the output line of the stage and an input line of the first supply voltage, and a control electrode that controls the conduction path in accordance with the voltage on the second node.

33. The shift register with a built-in level shifter according to claim 32, wherein the output buffer further includes:
a first capacitor connected between the control electrode of the sixth transistor and the output line of the stage for bootstrapping a voltage of the control electrode.

34. The shift register with a built-in level shifter according to claim 32, wherein the third controller includes:
an eighth transistor having a conduction path between the third node and an output line of the level shifter, and a control electrode that controls the conduction path in accordance with the fourth clock signal; and
a ninth transistor having a conduction path between an input line of the third supply voltage and the third node, and a control electrode that controls the conduction path in accordance with a voltage on the first node.

35. The shift register with a built-in level shifter according to claim 34, wherein the output part includes:
a tenth transistor having a conduction path between the input line of the third supply voltage and the output line of the level shifter, and a control electrode that controls the conduction path in accordance with the voltage on the third node; and
an eleventh transistor having a conduction path between the output line of the level shifter and the input line of the first supply voltage, and a control electrode that controls the conduction path in accordance with the clock signal at the fourth clock signal input line.

36. The shift register with a built-in level shifter according to claim 35, wherein the level shifter further includes:
a twelfth transistor having a conduction path between the output line of the level shifter and the input line of the first supply voltage, and a control electrode that controls the conduction path in accordance with the voltage on the second node in order to prevent an output voltage of the output line of the level shifter from being distorted by external noise.

37. The shift register with a built-in level shifter according to claim 36, wherein the level shifter further includes:
a thirteenth transistor having a conduction path between the third node and the level shifter, and a control electrode that controls the conduction path in accordance with the voltage on the second node in order to prevent the output voltage of the output line of the level shifter from being distorted by a current leaked from the tenth transistor when the third node is in a floating state.

38. The shift register with a built-in level shifter according to claim 37, wherein the level shifter further includes:
a fourteenth transistor having a conduction path between the output line of the level shifter and the input line of the first supply voltage, and a control electrode that controls the conduction path in accordance with a clock signal at a fifth clock signal input line in order to prevent the output voltage of the output line of the level shifter from being distorted by having the tenth transistor turned on, which is caused by the ninth transistor being turned on in accordance with the voltage on the first node in an interval when the start pulse is inputted.

39. The shift register with a built-in level shifter according to claim 38, wherein the level shifter further includes:
a fifteenth transistor having a conduction path between the input line of the third supply voltage and an input line of the ninth transistor, and a control electrode that controls the conduction path in accordance with the third supply voltage in order to prevent the output voltage of the output line of the level shifter from being distorted by a current leaked from the ninth transistor.

40. The shift register with a built-in level shifter according to claim 38, wherein the clock signals at the third and fifth clock signal input lines are the same.

41. The shift register with a built-in level shifter according to claim 35, wherein the output part further includes:
a second capacitor connected between the control electrode of the tenth transistor and the output line of the level shifter for bootstrapping a voltage of the control electrode.

42. The shift register with a built in level shifter according to claim 24, wherein the third supply voltage has the highest voltage level, then the second supply voltage, and the first supply voltage has the lowest voltage level.

43. The shift register with a built-in level shifter according to claim 24, wherein the clock signals at the first to fourth clock signal input lines have their phases delayed by one clock signal in order of the clock signal at the third clock signal input line, the clock signal at the first clock signal input line, the clock signal at the fourth clock signal input line, and the clock signal at the second clock signal input line, wherein and the clock signal at the third clock signal input line has the same phase as the start pulse.

44. The shift register with a built-in level shifter according to claim 43, wherein the third controller includes:
an eighth transistor having a conduction path between the third node and an output line of the level shifter, and a control electrode that controls the conduction path in accordance with the clock signal at the fourth clock signal input line; and
a ninth transistor having a conduction path between an input line of the third supply voltage and the third node, and a control electrode that controls the conduction path in accordance with a voltage on the first node,
and the output part includes:
a tenth transistor having conduction path between the input line of the third supply voltage and the output line of the level shifter, and a control electrode that controls the conduction path in accordance with a voltage on the third node; and an eleventh transistor having conduction path between the output line of the level shifter and the input line of the first supply voltage, and a control electrode that controls the conduction path in accordance with the second clock signal.

45. The shift register with a built-in level shifter according to claim 44, wherein an output pulse from the level shifter partially overlaps with an output pulse of the previous level shifter.

46. A scanning driver for applying a scanning pulse to scanning lines of a display panel, comprising a shift register that includes:

a plurality of stages connected in cascade for shifting a start pulse inputted through an input terminal and sequentially outputting the shifted pulse; and a plurality of level shifters for level-shifting a voltage level of the shifted pulse applied from each of the stages and outputting it as the scanning pulse, wherein each of the stages includes an output buffer for selecting and outputting either a clock signal at a first clock signal input line or a first supply voltage in accordance with voltages of a first node and a second node, wherein each of the stages includes a first controller for controlling the first node in accordance with the start pulse and a second controller for controlling the second node in accordance with the start pulse and a clock signal at a second clock signal input line wherein each of the level shifters includes an output part for selecting and outputting either the first supply voltage or a third supply voltage in accordance with a voltage on a third node and a third controller for controlling the third node in accordance with a clock signal at a fourth clock signal input line and the first node.

47. The scanning driver according to claim 46, wherein the shift register include thin film transistors of only the same type channel.

48. The scanning driver according to claim 47, wherein the shift register include thin film transistors of only P-type channel.

49. The scanning driver according to claim 46, wherein the level shifter shifts a minimal voltage level of the shifted pulse to a negative voltage and outputs it.

50. The scanning driver according to claim 46, wherein the first controller includes:

a first transistor having a conduction path between the start pulse and the first node, and a control electrode that controls the conduction path in accordance with the start pulse.

51. The scanning driver according to claim 50, wherein the first controller further includes:

a second transistor having a conduction path between an output terminal of the first transistor and the first node, and a control electrode that controls the conduction path in accordance with a clock signal at a third clock signal input line.

52. The scanning driver according to claim 51, wherein the first controller further includes:

a third transistor having a conduction path between the first node and an input line of the first supply voltage, and a control electrode that controls the conduction path in accordance with a voltage on the second node.

53. The scanning driver according to claim 52, wherein the second controller includes:

a fourth transistor having a conduction path between an input line of a second supply voltage and the second node, and a control electrode that controls the conduction path in accordance with the clock signal at the second clock signal input line; and a fifth transistor having a conduction path between the second node and the input line of the first supply voltage, and a control electrode that controls the conduction path in accordance with the start pulse.

54. The scanning driver according to claim 53, wherein the output buffer includes:

a sixth transistor having a conduction path between the first clock signal input line and an output line of the stage, and a control electrode that controls the conduction path in accordance with a voltage on the first node; and a seventh transistor having a conduction path between the output line of the stage and an input line of the first supply voltage, and a control electrode that controls the conduction path in accordance with a voltage on the second node.

55. The scanning driver according to claim 54, wherein the output buffer further includes:

a first capacitor connected between the control electrode of the sixth transistor and the output line of the stage for bootstrapping a voltage of the control electrode.

56. The scanning driver according to claim 54, wherein the third controller includes:

an eighth transistor having a conduction path between the third node and an output line of the level shifter, and a control electrode that controls the conduction path in accordance with the fourth clock signal; and a ninth transistor having a conduction path between an input line of the third supply voltage and the third node, and a control electrode that controls the conduction path in accordance with a voltage on the first node.

57. The scanning driver according to claim 56, wherein the output part includes:

a tenth transistor having a conduction path between the input line of the third supply voltage and the output line of the level shifter, and a control electrode that controls the conduction path in accordance with a voltage on the third node; and an eleventh transistor having a conduction path between the output line of the level shifter and the input line of the first supply voltage, and a control electrode that controls the conduction path in accordance with the clock signal at the fourth clock signal input line.

58. The scanning driver according to claim 57, wherein the level shifter further includes:

a twelfth transistor having a conduction path between the output line of the level shifter and the input line of the first supply voltage, and a control electrode that controls the conduction path in accordance with the voltage on the second node in order to prevent an output voltage of the output line of the level shifter from being distorted by an external noise.

59. The scanning driver according to claim 58, wherein the level shifter further includes:

a thirteenth transistor having a conduction path between the third node and the level shifter, and a control electrode that controls the conduction path in accordance with the voltage on the second node in order to prevent the output voltage of the output line of the level shifter from being distorted by a current leaked from the tenth transistor when the third node is in a floating state.

60. The scanning driver according to claim 59, wherein the level shifter further includes:
a fourteenth transistor having a conduction path between the output line of the level shifter and the input line of the first supply voltage, and a control electrode that controls the conduction path in accordance with a clock signal at a fifth clock signal input line in order to prevent the output voltage of the output line of the level shifter from being distorted by having the tenth transistor turned on, which is caused by the ninth transistor being turned on in accordance with the voltage on the first node in an interval when the start pulse is inputted.

61. The scanning driver according to claim 60, wherein the level shifter further includes:
a fifteenth transistor having a conduction path between the input line of the third supply voltage and an input line of the ninth transistor, and a control electrode that controls the conduction path in accordance with the third supply voltage in order to prevent the output voltage of the output line of the level shifter from being distorted by a current leaked from the ninth transistor.

62. The scanning driver according to claim 60, wherein the clock signals at the third and fifth clock signal input lines are the same.

63. The scanning driver according to claim 57, wherein the output part further includes:
a second capacitor connected between the control electrode of the tenth transistor and the output line of the level shifter for bootstrapping a voltage of the control electrode.

64. The scanning driver according to claim 46, wherein the third supply voltage has the highest voltage level, the first supply voltage has the lowest voltage level and the second supply voltage is between the third and first supply voltages.

65. The scanning driver according to claim 46, wherein the clock signals at the first to fourth clock signal input lines have their phases delayed by one clock signal in order of the clock signal at the third clock signal input line, the clock signal at the first clock signal input line, the clock signal at the fourth clock signal input line, and the clock signal at the second clock signal input line, wherein and the clock signal at the third clock signal input line has the same phase as the start pulse.

66. The scanning driver according to claim 65, wherein the third controller includes:
an eighth transistor having a conduction path between the third node and an output line of the level shifter, and a control electrode that controls the conduction path in accordance with the clock signal at the fourth clock signal input line; and
a ninth transistor having a conduction path between an input line of the third supply voltage and the third node, and a control electrode that controls the conduction path in accordance with the voltage on the first node, and the output part includes:
a tenth transistor having conduction path between the input line of the third supply voltage and the output line of the level shifter, and a control electrode that controls the conduction path in accordance with a voltage on the third node; and
an eleventh transistor having conduction path between the output line of the level shifter and the input line of the first supply voltage, and a control electrode that controls the conduction path in accordance with the second clock signal.

67. The scanning driver according to claim 66, wherein an output pulse from the level shifter partially overlaps with an output pulse of the previous level shifter.

68. A data driver for applying a video signal to data lines of a display panel, comprising:
a sampling switch array for sampling and outputting the video signal in response to an input sampling signal; and
a shift register that includes a plurality of stages connected in cascade for shifting a start pulse inputted through an input terminal and sequentially outputting the shifted pulse; and a plurality of level shifters for level-shifting a voltage level of the shifted pulse applied from each of the stages and outputting it as the sampling signal,
wherein each of the stages includes an output buffer for selecting and outputting either a clock signal at a first clock signal input line or a first supply voltage in accordance with voltages of a first node and a second nodes,
wherein each of the stages includes a first controller for controlling the first node in accordance with the start pulse and a second controller for controlling the second node in accordance with the start pulse and a clock signal at a second clock signal input line,
wherein each of the level shifters includes an output part for selecting and outputting either the first supply voltage or a third supply voltage in accordance with a voltage on a third node and a third controller for controlling the third node in accordance with a clock signal at a fourth clock signal input line and the first node.

69. The data driver according to claim 68, wherein the shift register include thin film transistors of only the same type channel.

70. The data driver according to claim 69, wherein the shift register include thin film transistors of only P-type channel.

71. The data driver according to claim 68, wherein the level shifter shifts a minimal voltage level of the shifted pulse to a negative voltage and outputs it.

72. The data driver according to claim 68, wherein the first controller includes:
a first transistor having a conduction path between the start pulse and the first node, and a control electrode that controls the conduction path in accordance with the start pulse.

73. The data driver according to claim 72, wherein the first controller further includes:
a second transistor having a conduction path between an output terminal of the first transistor and the first node, and a control electrode that controls the conduction path in accordance with a clock signal at a third clock signal input line.

74. The data driver according to claim 73, wherein the first controller further includes:
a third transistor having a conduction path between the first node and an input line of the first supply voltage, and a control electrode that controls the conduction path in accordance with the voltage on the second node.

75. The data driver according to claim 74, wherein the second controller includes:
a fourth transistor having a conduction path between an input line of a second supply voltage and the second node, and a control electrode that controls the conduction path in accordance with the clock signal at the second clock signal input line; and
a fifth transistor having a conduction path between the second node and the input line of the first supply voltage, and a control electrode that controls the conduction path in accordance with the start pulse.

76. The data driver according to claim 75, wherein the output buffer includes:
a sixth transistor having a conduction path between the first clock signal input line and an output line of the stage, and a control electrode that controls the conduction path in accordance with the voltage on the first node; and
a seventh transistor having a conduction path between the output line of the stage and the input line of the first supply voltage, and a control electrode that controls the conduction path in accordance with a voltage on the second node.

77. The data driver according to claim 76, wherein the output buffer further includes:
a first capacitor connected between the control electrode of the sixth transistor and the output line of the stage for bootstrapping a voltage of the control electrode.

78. The data driver according to claim 68, wherein the third controller includes:
an eighth transistor having a conduction path between the third node and an output line of the level shifter, and a control electrode that controls the conduction path in accordance with the fourth clock signal; and
a ninth transistor having a conduction path between an input line of the third supply voltage and the third node, and a control electrode that controls the conduction path in accordance with a voltage on the first node.

79. The data driver according to claim 78, wherein the output part includes:
a tenth transistor having a conduction path between the input line of the third supply voltage and the output line of the level shifter, and a control electrode that controls the conduction path in accordance with the voltage on the third node; and
an eleventh transistor having a conduction path between the output line of the level shifter and the input line of the first supply voltage, and a control electrode that controls the conduction path in accordance with the clock signal at the fourth clock signal input line.

80. The data driver according to claim 79, wherein the level shifter further includes:
a twelfth transistor having a conduction path between the output line of the level shifter and the input line of the first supply voltage, and a control electrode that controls the conduction path in accordance with the voltage on the second node in order to prevent an output voltage of the output line of the level shifter from being distorted by an external noise.

81. The data driver according to claim 80, wherein the level shifter further includes:
a thirteenth transistor having a conduction path between the third node and the level shifter, and a control electrode that controls the conduction path in accordance with the voltage on the second node in order to prevent the output voltage of the output line of the level shifter from being distorted by a current leaked from the tenth transistor when the third node is in a floating state.

82. The data driver according to claim 81, wherein the level shifter further includes:
a fourteenth transistor having a conduction path between the output line of the level shifter and the input line of the first supply voltage, and a control electrode that controls the conduction path in accordance with a clock signal at a fifth clock signal input line in order to prevent the output voltage of the output line of the level shifter from being distorted by having the tenth transistor turned on, which is caused by the ninth transistor being turned on in accordance with the voltage on the first node in an interval when the start pulse is inputted.

83. The data driver according to claim 82, wherein the level shifter further includes:
a fifteenth transistor having a conduction path between the input line of the third supply voltage and an input line of the ninth transistor, and a control electrode that controls the conduction path in accordance with the third supply voltage in order to prevent the output voltage of the output line of the level shifter from being distorted by a current leaked from the ninth transistor.

84. The data driver according to claim 82, wherein the clock signals at the third and fifth clock signal input lines are the same.

85. The data driver according to claim 79, wherein the output part further includes:
a second capacitor connected between the control electrode of the tenth transistor and the output line of the level shifter for bootstrapping a voltage of the control electrode.

86. The data driver according to claim 68, wherein the third supply voltage has the highest voltage level, the first supply voltage has the lowest voltage level and the second supply voltage is between the third and first supply voltages.

87. The data driver according to claim 68, wherein the clock signals at the first to fourth clock signal input lines have their phases delayed by one clock signal in order of the clock signal at the third clock signal input line, the clock signal at the first clock signal input line, the clock signal at the fourth clock signal input line, and the clock signal at the second clock signal input line, wherein and the clock signal at the third clock signal input line has the same phase as the start pulse.

88. The data driver according to claim 87, wherein the third controller includes:
an eighth transistor having a conduction path between the third node and an output line of the level shifter, and a control electrode that controls the conduction path in accordance with the clock signal at the fourth clock signal input line; and
a ninth transistor having a conduction path between an input line of the third supply voltage and the third node, and a control electrode that controls the conduction path in accordance with a voltage on the first node,
and the output part includes:
a tenth transistor having conduction path between the input line of the third supply voltage and the output line of the level shifter, and a control electrode that controls the conduction path in accordance with a voltage on the third node; and
an eleventh transistor having conduction path between the output line of the level shifter and the input line of the first supply voltage, and a control electrode that controls the conduction path in accordance with the second clock signal.

89. The data driver according to claim 88, wherein an output pulse from the level shifter partially overlaps with an output pulse of the previous level shifter.

* * * * *